United States Patent
Kim et al.

(10) Patent No.: US 11,251,247 B2
(45) Date of Patent: Feb. 15, 2022

(54) DISPLAY DEVICE AND METHOD FOR FABRICATING THE SAME

(71) Applicant: Samsung Display Co., Ltd., Yongin-si (KR)

(72) Inventors: Hyung Jun Kim, Seoul (KR); Myoung Hwa Kim, Seoul (KR); Tae Sang Kim, Seoul (KR); Yeon Keon Moon, Hwaseong-si (KR); Joon Seok Park, Yongin-si (KR); Sang Woo Sohn, Yongin-si (KR); Sang Won Shin, Yongin-si (KR); Jun Hyung Lim, Seoul (KR); Hye Lim Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/843,764

(22) Filed: Apr. 8, 2020

(65) Prior Publication Data
US 2021/0020717 A1 Jan. 21, 2021

(30) Foreign Application Priority Data
Jul. 17, 2019 (KR) .......... 10-2019-0086441

(51) Int. Cl.
*H01L 21/00* (2006.01)
*H01L 27/00* (2006.01)
(Continued)

(52) U.S. Cl.
CPC .... *H01L 27/3262* (2013.01); *H01L 21/02565* (2013.01); *H01L 21/465* (2013.01);
(Continued)

(58) Field of Classification Search
CPC ......... H01L 21/47635; H01L 21/47573; H01L 21/02565; H01L 21/465; H01L 27/3272;
(Continued)

(56) References Cited

U.S. PATENT DOCUMENTS 8,148,779 B2* 4/2012 Jeong ............. H01L 29/7869
257/347
9,293,602 B2* 3/2016 Yamazaki ........... H01L 29/045
(Continued)

FOREIGN PATENT DOCUMENTS

| JP | 2018-6729 A | 1/2018 |
|---|---|---|
| KR | 10-2015-0092722 A | 8/2015 |
| KR | 10-2015-0107622 A | 9/2015 |

OTHER PUBLICATIONS

Chen, Rongsheng et al., "Self-aligned top-gate InGaZnO thin film transistors using $SiO_2/Al_2O_3$ stack gate dielectric", Thin Solid Films, 548, 2013, pp. 572-575.

*Primary Examiner* — Nikolay K Yushin
(74) *Attorney, Agent, or Firm* — Lewis Roca Rothgerber Christie LLP

(57) ABSTRACT

A display device and a method for fabricating the same are provided. The display device comprises pixels connected to scan lines, and to data lines crossing the scan lines, each of the pixels including a light emitting element, and a first transistor configured to control a driving current supplied to the light emitting element according to a data voltage applied from the data line, the first transistor including a first active layer having an oxide semiconductor, and a first oxide layer on the first active layer and having a crystalline oxide containing tin (Sn).

26 Claims, 30 Drawing Sheets

(51) Int. Cl.

| | | |
|---|---|---|
| *H01L 29/00* | (2006.01) | |
| *H01L 27/32* | (2006.01) | |
| *H01L 29/786* | (2006.01) | |
| *H01L 29/24* | (2006.01) | |
| *H01L 29/66* | (2006.01) | |
| *H01L 21/02* | (2006.01) | |
| *H01L 21/4763* | (2006.01) | |
| *H01L 21/465* | (2006.01) | |
| *H01L 21/4757* | (2006.01) | |
| *H01L 27/12* | (2006.01) | |

(52) U.S. Cl.
CPC .. *H01L 21/47573* (2013.01); *H01L 21/47635* (2013.01); *H01L 27/3258* (2013.01); *H01L 27/3272* (2013.01); *H01L 27/3276* (2013.01); *H01L 29/24* (2013.01); *H01L 29/66969* (2013.01); *H01L 29/7869* (2013.01); *H01L 29/78603* (2013.01); *H01L 29/78633* (2013.01); *H01L 27/124* (2013.01); *H01L 27/1225* (2013.01); *H01L 27/1248* (2013.01); *H01L 27/1259* (2013.01); *H01L 2227/323* (2013.01)

(58) Field of Classification Search
CPC ............... H01L 27/124; H01L 27/1259; H01L 29/66969; H01L 29/24; H01L 29/78633; H01L 29/78603; H01L 29/7869; H01L 2227/323; H01L 2227/326; H01L 27/3276; H01L 27/3258; H01L 27/3262; H01L 27/1248; H01L 27/1225

See application file for complete search history.

(56) References Cited

U.S. PATENT DOCUMENTS

| | | | |
|---|---|---|---|
| 9,583,638 B2* | 2/2017 | Kim | H01L 29/78696 |
| 9,917,207 B2* | 3/2018 | Yamazaki | H01L 23/528 |
| 10,361,290 B2* | 7/2019 | Yamazaki | H01L 21/02554 |
| 10,403,757 B2* | 9/2019 | Zhou | H01L 27/3244 |
| 2009/0321731 A1* | 12/2009 | Jeong | H01L 29/7869 |
| | | | 257/43 |
| 2011/0108835 A1* | 5/2011 | Kim | H01L 29/7869 |
| | | | 257/43 |
| 2014/0042437 A1* | 2/2014 | Yamazaki | H01L 29/7869 |
| | | | 257/43 |
| 2015/0263141 A1* | 9/2015 | Yamazaki | H01L 21/02326 |
| | | | 438/104 |
| 2017/0186875 A1* | 6/2017 | Yamazaki | H01L 23/528 |
| 2019/0172954 A1* | 6/2019 | Zhou | H01L 29/78633 |

* cited by examiner

FIG. 24
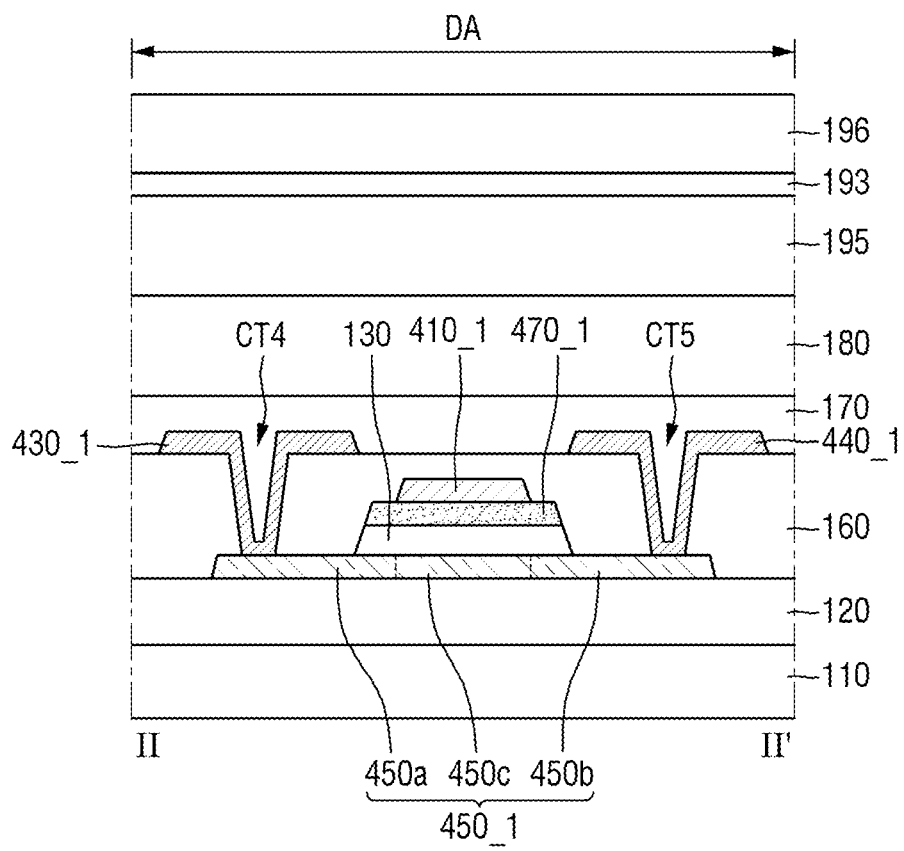
TR2_1 : 410_1, 430_1, 440_1, 450_1, 470_1
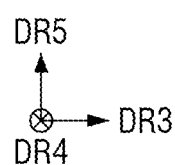

DISPLAY DEVICE AND METHOD FOR FABRICATING THE SAME

CROSS-REFERENCE TO RELATED APPLICATION

This application claims priority to, and the benefit of, Korean Patent Application No. 10-2019-0086441 filed on Jul. 17, 2019 in the Korean Intellectual Property Office, the contents of which in its entirety are herein incorporated by reference.

BACKGROUND

1. Field

Embodiments of the present disclosure relate to a display device including a thin film transistor including an oxide layer, and to a method for fabricating the same.

2. Description of the Related Art

The importance of display devices has steadily increased with the development of multimedia technology. Accordingly, various types of display devices, such as an organic light emitting display (OLED), a liquid crystal display (LCD), and the like, have been used.

A display device is a device for displaying an image, and includes a display panel, such as an organic light emitting display panel or a liquid crystal display panel. Among them, a light emitting display panel may include a light emitting element. Examples of a light emitting diode (LED) include an organic light emitting diode (OLED) using an organic material as a fluorescent material, and an inorganic light emitting diode using an inorganic material as a fluorescent material.

The display device includes a display panel, a gate driving circuit, a data driving circuit and a timing controller. The display panel includes data lines, gate lines, and pixels formed at crossing regions of the data lines and the gate lines. Each of the pixels receives a data voltage from the data line when a gate signal is supplied to the gate line using a thin film transistor as a switching element. Each of the pixels emits light (e.g., light with a predetermined brightness) according to the data voltage.

Recently, a display device capable of displaying an image with a high resolution of Ultra High Definition (UHD) has been introduced, and a display device capable of displaying an image with a high resolution of 8K Ultra High Definition (8K UHD) is being developed. UHD refers to a resolution of 3,840×2,160 pixels, and 8K UHD refers to a resolution of 7,680×4,320 pixels.

In the case of a high resolution display device, as the number of pixels increases, a driving current of each of the pixels may decrease. As a result, a driving voltage range of a driving transistor of each pixel may be reduced.

SUMMARY

Aspects of the present disclosure provide a display device including a thin film transistor further including an oxide layer.

However, aspects of the present disclosure are not restricted to those set forth herein. The above and other aspects of the present disclosure will become apparent to one of ordinary skill in the art to which the present disclosure pertains by referencing the detailed description of the present disclosure given below, including other aspects that are not described herein.

A display device according to some embodiments may include a driving transistor including an active layer having an oxide semiconductor and an oxide layer having a crystalline oxide containing tin. The oxide layer may inject oxygen into the active layer to lower the concentration of an oxygen defect region of the active layer. Accordingly, the driving transistor of the display device may have excellent device characteristics.

Further, according to some embodiments, as the driving transistor includes an oxide layer having a crystalline oxide, it is possible to reduce or prevent the likelihood of an undercut phenomenon that may occur in a process for forming a gate electrode. It is possible to reduce or prevent a likelihood of a defect that may be formed in an interlayer insulating layer formed on the gate electrode, and the driving transistor of the display device can secure excellent device reliability.

According to an embodiment of the present disclosure, a display device comprises pixels connected to scan lines, and to data lines crossing the scan lines, each of the pixels including a light emitting element, and a first transistor configured to control a driving current supplied to the light emitting element according to a data voltage applied from the data line, the first transistor including a first active layer having an oxide semiconductor, and a first oxide layer on the first active layer and having a crystalline oxide containing tin (Sn).

The first oxide layer may have a content of the tin in a range of about 1 at. % to about 100 at. % with respect to a content of cations contained in the crystalline oxide.

The first oxide layer may include tin-zinc oxide (TZO), tin-gallium oxide (TGO), indium-tin-zinc oxide (ITZO), indium-tin-gallium oxide (ITGO), or indium-tin-zinc-gallium oxide (ITZGO).

The first active layer may include indium-tin oxide (ITO), indium-tin-gallium oxide (ITGO), indium-gallium-zinc oxide (IGZO), or indium-gallium-zinc-tin oxide (IGZTO).

The first transistor may include a first gate insulating layer on the first active layer, and a first gate electrode on the first gate insulating layer and overlapping the first active layer, and the first oxide layer may be between the first gate electrode and the first gate insulating layer.

A concentration of oxygen in the first active layer may be greater than a concentration of oxygen in the first oxide layer.

The first active layer may include a first conducting region, a second conducting region, and a channel region between the first conducting region and the second conducting region, and at least a portion of the first oxide layer may overlap the channel region of the first active layer.

A width of the first oxide layer may be greater than a width of the channel region of the first active layer.

The first transistor may further include a first interlayer insulating layer on the first gate electrode, a first source electrode in contact with the first conducting region via a first contact hole passing through the first interlayer insulating layer, and a first drain electrode in contact with the second conducting region via a second contact hole passing through the first interlayer insulating layer.

The first transistor may further include a first light blocking layer below the first active layer, and a buffer layer between the first active layer and the first light blocking layer, wherein the first source electrode is in contact with the first light blocking layer via a third contact hole passing through the first interlayer insulating layer and the buffer layer.

At least one end of the first oxide layer may protrude outward beyond one end of the first gate electrode.

A width of the first oxide layer may be greater than a width of the first gate electrode.

At least a portion of an upper surface of the first oxide layer may be in contact with a first interlayer insulating layer on the first gate electrode.

One of the pixels may include a second transistor for applying the data voltage of a corresponding one of the data lines to the first transistor according to a scan signal applied to a corresponding one of the scan lines, and the second transistor may include a second active layer having an oxide semiconductor, a second gate insulating layer on the second active layer, and a second gate electrode on the second gate insulating layer and overlapping the second active layer.

The second transistor may further include a second oxide layer between the second gate insulating layer and the second gate electrode and partially overlapping the second active layer.

The display device may further include a scan driving circuit configured to output a scan signal to the scan line, wherein the scan driving circuit includes a third transistor including a third active layer having an oxide semiconductor, and a third gate electrode on the third active layer, the third transistor being configured such that the first oxide layer is not between the third active layer and the third gate electrode.

According to another embodiment of the present disclosure, a display device includes a substrate including a display area and a non-display area, a first active layer in the display area, a second active layer in the non-display area, a gate insulating layer on the first active layer and the second active layer, a first gate electrode on the gate insulating layer and partially overlapping the first active layer, a second gate electrode on the gate insulating layer and partially overlapping the second active layer, an interlayer insulating layer on the first gate electrode and the second gate electrode, a first source electrode and a first drain electrode on the interlayer insulating layer and in the display area, a second source electrode and a second drain electrode in the non-display area, and an oxide layer on the gate insulating layer, and having a crystalline oxide containing tin (Sn), wherein the first active layer and the second active layer include an oxide semiconductor.

The oxide layer may include a first oxide layer between the first gate electrode and the gate insulating layer, and a width of the first oxide layer may be greater than a width of the first gate electrode.

The first active layer may include a first conducting region, a second conducting region, and a channel region between the first conducting region and the second conducting region, and at least a portion of the first oxide layer may overlap the channel region of the first active layer.

The display device may further include an interlayer insulating layer on the first gate electrode, wherein the first source electrode is in contact with the first conducting region via a first contact hole passing through the interlayer insulating layer, and wherein the first drain electrode is in contact with the second conducting region via a second contact hole passing through the interlayer insulating layer.

The display device may further include a first light blocking layer below the first active layer, and a buffer layer between the first active layer and the first light blocking layer, wherein the first source electrode is in contact with the first light blocking layer via a third contact hole passing through the interlayer insulating layer and the buffer layer.

The oxide layer might not between the second gate electrode and the gate insulating layer.

The display device may further include an interlayer insulating layer on the second gate electrode, wherein the second active layer includes a third conducting region, a fourth conducting region, and a channel region between the third conducting region and the fourth conducting region, wherein the second source electrode is in contact with the third conducting region via a fourth contact hole passing through the interlayer insulating layer, and wherein the second drain electrode is in contact with the fourth conducting region via a fifth contact hole passing through the interlayer insulating layer.

According to an embodiment of the present disclosure, a method for fabricating a display device includes forming a substrate, an active layer on the substrate, and a gate insulating layer on the active layer, forming an oxide layer on the gate insulating layer and having a crystalline oxide containing tin (Sn), and a metal layer on the oxide layer, performing a first etching for etching at least a portion of the metal layer to form a gate electrode, and performing a second etching for etching at least a portion of the oxide layer and the gate insulating layer to form a first oxide layer.

The active layer may include a first active layer and a second active layer having an oxide semiconductor, wherein the gate electrode includes a first gate electrode overlapping the first active layer and a second gate electrode overlapping the second active layer, and wherein the first oxide layer is between the first gate electrode and the first active layer.

A width of the first oxide layer may be greater than a width of the first gate electrode.

The first oxide layer might not between the second active layer and the second gate electrode.

The first etching may include a wet etching process, and the second etching includes a dry etching process.

BRIEF DESCRIPTION OF THE DRAWINGS

The above and other aspects and features of the present disclosure will become more apparent by describing in detail embodiments thereof with reference to the attached drawings, in which:

FIG. 24 is a cross-sectional view illustrating a second transistor according to another embodiment;

DETAILED DESCRIPTION

Figure 1:
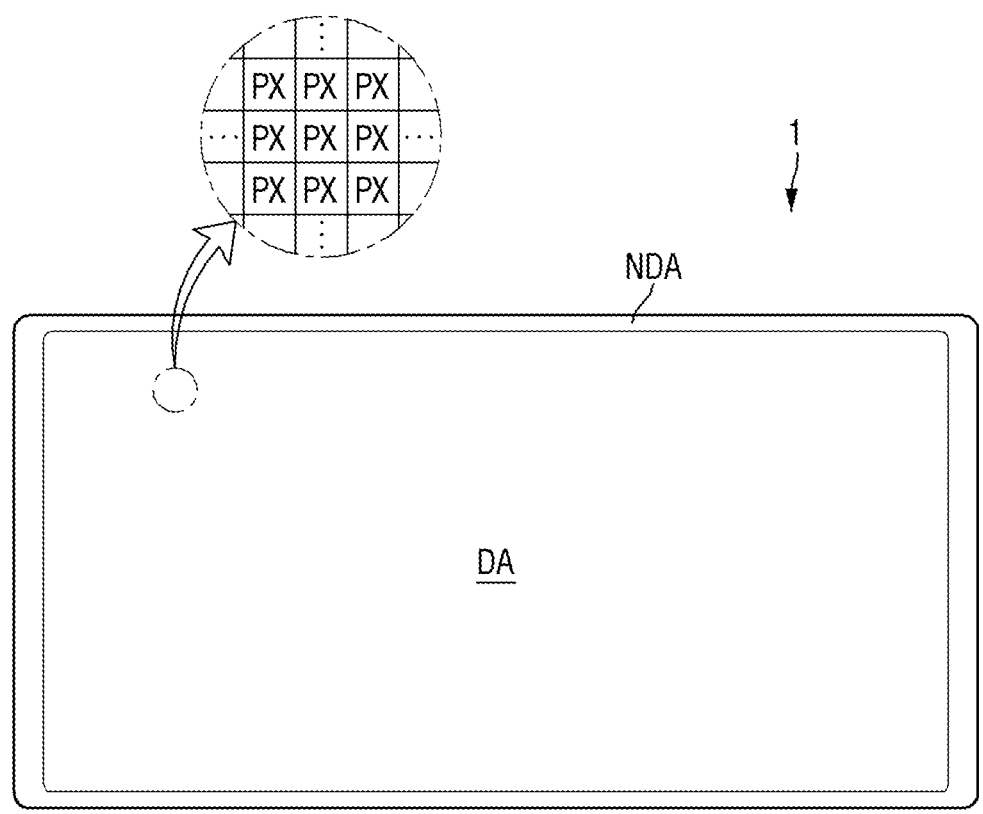
FIG. 1 is a plan view illustrating a display device according to some embodiments.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of some embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to some embodiments.

Referring to FIG. 1, a display device 1 displays a moving image or a still image. The display device 1 may refer to any electronic device providing a display screen. Examples of the display device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 1 includes a display panel that provides a display screen. Examples of the display panel may include an LED display panel, an organic light emitting display panel, a quantum dot light emitting display panel, a plasma display panel and a field emission display panel. In the following description, a case where an LED display panel is applied as a display panel will be described, but the present disclosure is not limited thereto, and other display panels may be applied within the scope of the same technical ideas.

The shape of the display device 1 may be variously modified. For example, the display device 1 may have a shape, such as a rectangular shape elongated in a horizontal direction, a rectangular shape elongated in a vertical direction, a square shape, a quadrilateral shape with rounded corners (vertices), other polygonal shapes, and/or a circular shape. The shape of a display area DA of the display device 1 may also be similar to the overall shape of the display device 1. In FIG. 1, the display device 1 and the display area DA having a rectangular shape elongated in the horizontal direction are illustrated.

The display device 1 may include a display area DA and a non-display area NDA. The display area DA is an area where a screen can be displayed, and the non-display area NDA is an area where a screen is not displayed. The display area DA may also be referred to as an active region, and the non-display area NDA may also be referred to as a non-active region.

The display area DA may substantially occupy the center of the display device 1. The display area DA may include a plurality of pixels PX. The plurality of pixels PX may be arranged in a matrix. The shape of each pixel PX may be a rectangular or square shape in plan view. However, the present disclosure is not limited thereto, and it may be a rhombic shape in which each side is inclined with respect to a first direction DR1.

Figure 2:
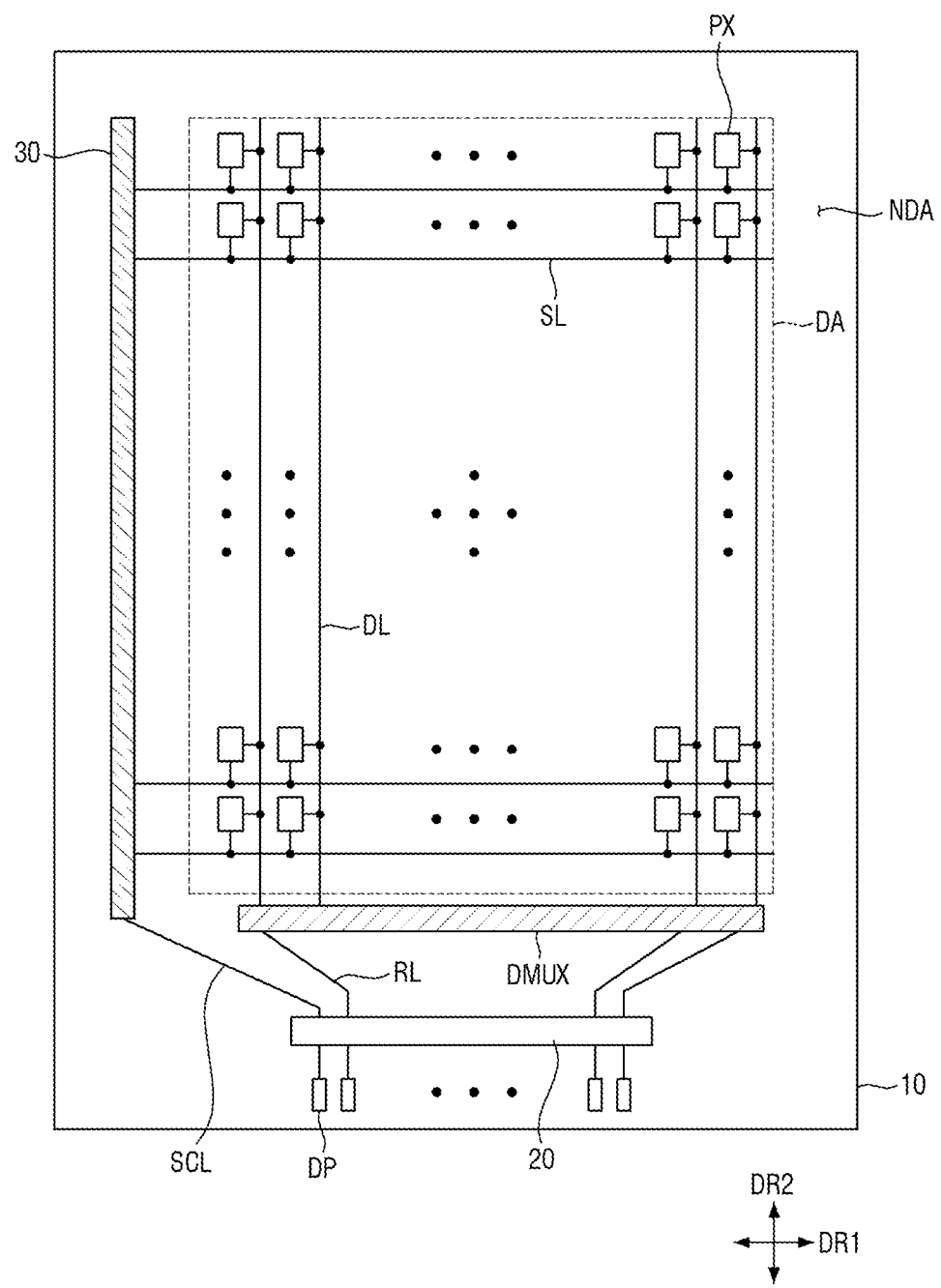
FIG. 2 is a schematic plan view of a display device according to some embodiments.

FIG. 2 is a schematic plan view of a display device according to some embodiments.

Referring to FIG. 2, the display device 1 includes a display panel 10, an integrated driving circuit 20 and a scan driving circuit 30. The integrated driving circuit 20 may include a timing controller and a data driver.

The display panel 10 may include a display area DA where pixels PX are formed to display an image, and a non-display area NDA that is a peripheral area of the display area DA. When the display panel 10 includes a curved surface portion, the display area DA may be located on the curved surface portion. In this case, the image of the display panel 10 may also be seen on the curved surface portion.

In the display area DA, not only the pixels PX, but also located may be scan lines SL1 to SLk (k is an integer of 2 or more), data lines DL1 to DLj (j is an integer of 2 or more), and power supply lines, which are connected to the pixels PX. The scan lines SL may be formed in parallel in the first direction DR1, and the data lines DL may be formed in parallel in a second direction DR2 that intersects the first direction DR1. Each of the pixels PX may be connected to at least one of the scan lines SL and one of the data lines DL.

Each of the pixels may include a driving transistor, at least one switching transistor, a light emitting element, and a capacitor. Because the switching transistor is turned on when a scan signal is applied from the scan line SL, a data voltage of the data line DL may be applied to a gate electrode of the driving transistor. The driving transistor may emit light by supplying a driving current to the light emitting element according to the data voltage applied to the gate electrode. The driving transistor and the at least one switching transistor may be thin film transistors. The light emitting element may emit light according to the driving current of the driving transistor. The light emitting element may be an organic light emitting diode including a first electrode, an organic light emitting layer, and a second electrode. The capacitor may serve to keep constant, or to stabilize, the data voltage applied to the gate electrode of the driving transistor.

The non-display area NDA may be defined as an area from the outside of the display area DA to the edges of the display panel 10. The scan driving circuit 30 for applying scan signals to the scan lines SL, and a data voltage distribution circuit DMUX connected between the data lines DL and routing lines RL in the non-display area NDA, may be located in the non-display area NDA. Further, pads DP electrically connected to the integrated driving circuit 20 may be located in the non-display area NDA. In this case, the integrated driving circuit 20 and the pads DP may be located at one edge of the display panel 10.

The integrated driving circuit 20 is connected to the display pads DP to receive digital video data and timing signals. The integrated driving circuit 20 converts the digital video data into analog positive/negative data voltages, and supplies them to the data lines DL through the routing lines RL and the data voltage distribution circuit DMUX. Further, the integrated driving circuit 20 generates and supplies a scan control signal for controlling the scan driving circuit 30 through a scan control line SCL. The pixels PX to which the data voltages are supplied are selected by the scan signals of the scan driving circuit 30, and the data voltages are supplied to the selected pixels XP. In addition, the integrated driving circuit 20 may supply power supply voltages to the power supply lines.

The integrated driving circuit 20 may be formed as an integrated circuit (IC) and may be mounted on the display panel 10 in the pad area by a chip on glass (COG) method, a chip on plastic (COP) method, or an ultrasonic bonding method, but the present disclosure is not limited thereto. For example, the integrated drive circuit 20 may be mounted on a separate circuit board.

The pads DP may be electrically connected to the integrated driving circuit 20. In some embodiments, the circuit board may be attached onto the pads DP using an anisotropic conductive film. Accordingly, the lead lines of the circuit board may be electrically connected to the pads DP. The circuit board may be a flexible film, such as a flexible printed circuit board, a printed circuit board, or a chip on film. The circuit board may be bent toward the lower side of the display panel 10. In this case, one side of the circuit board may be attached to one edge of the display panel 10, and the other side of the circuit board may be located below the display panel 10 and may be connected to a system board on which a host system is mounted.

The scan driving circuit 30 may be connected to the integrated driving circuit 20 through at least one scan control line SCL to receive a scan control signal. The scan driving circuit 30 may generate scan signals according to the scan control signal, and may sequentially output the scan signals to the scan lines SL. Although FIG. 2 illustrates that the scan driving circuit 30 is formed on one side of the display area DA, for example, in the non-display area NDA on the left side, the present disclosure is not limited thereto. For example, the scan driving circuit 30 may be a plurality formed at multiple sides of the display area DA, for example, in the non-display area NDA on the left and right sides.

The data voltage distribution circuit DMUX may be connected between the routing lines RL and the data lines DL. A ratio of the number of the routing lines RL to the number of the data lines DL connected to the data voltage distribution circuit DMUX may be 1:q (q is an integer of 2 or more). The data voltage distribution circuit DMUX may serve to distribute data voltages applied to one routing line RL to a plurality of corresponding data lines DL.

A power supply circuit may generate voltages required for driving the display panel 10 from a main power source applied from the system board, and may supply the voltages to the display panel 10. For example, the power supply circuit may generate a first power supply voltage and a second power supply voltage for driving light emitting elements EL of the display panel 10 from the main power source, and may supply them to a first voltage line VDD (see FIG. 3) and a second voltage line VSS (see FIG. 3) of the display panel 10. Further, the power supply circuit may generate driving voltages for driving the integrated driving circuit 20 and the scan driving circuit 30 from the main power source, and may supply them.

The power supply circuit may be formed as an integrated circuit, and may be mounted on a circuit board, but the present disclosure is not limited thereto. For example, the power supply circuit may be formed integrally with the integrated driving circuit 20.

Figure 3:
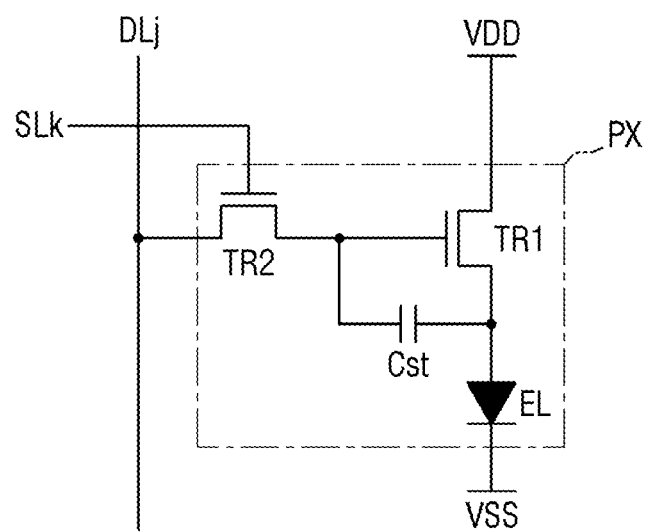
FIG. 3 is a circuit diagram showing one pixel of FIG. 2, according to some embodiments of the present disclosure.

FIG. 3 is a circuit diagram showing one pixel of FIG. 2, according to some embodiments of the present disclosure.

Referring to FIG. 3, the pixel PX may include a first transistor TR1, a second transistor TR2, a light emitting element EL, and a capacitor Cst. Although FIG. 3 illustrates that the pixel PX has a 2T1C (2Transistor-1Capacitor) structure having one first transistor TR1, one second transistor TR2, and one capacitor Cst, the present disclosure is not limited thereto. Each pixel PX may include a greater number of transistors and/or a plurality of capacitors.

Each of the first and second transistors TR1 and TR2 may include a first electrode, a second electrode, and a gate electrode. One of the first electrode and the second electrode may be a source electrode, and the other one may be a drain electrode.

Each of the first and second transistors TR1 and TR2 may be formed as a thin film transistor. Further, although it has been illustrated in FIG. 3 that each of the first and second transistors TR1 and TR2 is formed as an N-type Metal Oxide Semiconductor Field Effect Transistor (MOSFET), the present disclosure is not limited thereto. Each of the first transistor TR1 and the second transistor TR2 may be formed as a P-type MOSFET. In this case, the positions of the source electrode and the drain electrode of each of the first transistor TR1 and the second transistor TR2 may be changed. In the following description, it is assumed that the first and second transistors TR1 and TR2 are N-type MOSFETs.

The first transistor TR1 may emit light by supplying a driving current to the light emitting element EL according to the data voltage applied to the gate electrode. That is, the first transistor TR1 may be a driving transistor. The gate electrode of the first transistor TR1 may be connected to the source electrode of the second transistor TR2, the source electrode of the first transistor TR1 may be connected to the first electrode of the light emitting element EL, and the drain electrode of the first transistor TR1 may be connected to the first voltage line VDD to which the first power supply voltage is applied.

Because the second transistor TR2 is turned on when a scan signal is applied from the $k^{th}$ scan line SLk (k is a positive integer), a data voltage of the data line DLj may be applied to the gate electrode of the first transistor TR1. That is, the second transistor TR2 may be a switching transistor. The gate electrode of the second transistor TR2 may be connected to the $k^{th}$ scan line SLk, the source electrode of the second transistor TR2 may be connected to the gate electrode of the first transistor TR1, and the drain electrode of the second transistor TR2 may be connected to the $j^{th}$ data line DLj.

The capacitor Cst may be connected between the gate electrode and the source electrode of the first transistor TR1. Accordingly, the capacitor Cst may serve to keep constant, or to stabilize, the data voltage applied to the gate electrode of the first transistor TR1.

The light emitting element EL may emit light according to the driving current of the first transistor TR1. The light emitting element EL may be an organic light emitting diode including a first electrode, an organic light emitting layer, and a second electrode. The first electrode of the light emitting element EL may be connected to the source electrode of the first transistor TR1, and the second electrode of the light emitting element EL may be connected to the second voltage line VSS to which the second power supply voltage lower than the first power supply voltage is applied.

Figure 4:
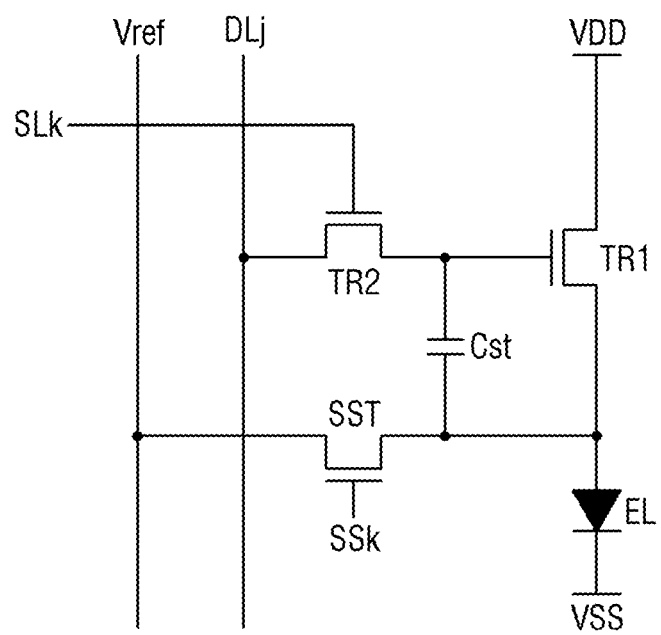
FIG. 4 is a circuit diagram showing one pixel of FIG. 2, according to some embodiments of the present disclosure.

FIG. 4 is a circuit diagram showing one pixel of FIG. 2, according to some embodiments of the present disclosure.

Referring to FIG. 4, the pixel PX may include a first transistor TR1, a second transistor TR2, a sensing transistor SST, a light emitting element EL, and a capacitor Cst. FIG. 4 illustrates that the pixel PX has a 3T1C (3Transistor-1Capacitor) structure having one first transistor TR1, one second transistor TR2, a sensing transistor SST, and one capacitor Cst. The circuit diagram of FIG. 4 is the same as the circuit diagram of FIG. 3, except that the circuit diagram of FIG. 4 further includes a sensing transistor SST and a reference line Vref.

The circuit diagram of FIG. 4 may further include a compensation circuit including the sensing transistor SST and the reference line Vref. The compensation circuit is a circuit added in each pixel PX to compensate a threshold voltage of the first transistor TR1, which is a driving transistor, and the like.

The sensing transistor SST may have one electrode (e.g., the source electrode) that is connected between the source electrode of the first transistor TR1 and the first electrode of the light emitting element EL. The gate electrode of the sensing transistor SST may be connected to the $k^{th}$ sensing signal line SSk, the drain electrode of the sensing transistor SST may be connected to the reference line Vref, and the source electrode of the sensing transistor SST may be connected to one end of the capacitor Cst. The sensing transistor SST is turned on by a sensing signal of the $k^{th}$ sensing signal line SSk to supply a reference voltage, which is transmitted through the reference line Vref, to the source electrode of the first transistor TR1, or operates to sense the voltage or current of the source electrode of the first transistor TR1.

The reference line Vref may be connected to the scan driving circuit 30. In this case, the scan driving circuit 30 may sense the source electrode of the first transistor TR1 of each pixel PX in real time, during a non-display period of an image, or during a period of an N frame (N is an integer of 1 or more), or during a period of multiple frames, and may generate the sensing result. On the other hand, the second transistor TR2, which is a switching transistor, and the sensing transistor SST, which is a sensing transistor, may be turned on at the same time. In this case, a sensing operation through the reference line Vref, and a data output operation for outputting a data signal, are separated from each other according to a time division method of the scan driving circuit 30.

In addition, a compensation target according to the sensing result may be a digital data signal, an analog data signal, gamma, or the like. Further, a compensation circuit for generating a compensation signal based on the sensing result may be implemented as a circuit in the scan driving circuit 30, a circuit in the timing controller or in the integrated driving circuit 20, or a separate circuit.

However, the present disclosure is not limited thereto. In FIGS. 3 and 4, the respective pixel PX having the 2T1C structure and the 3T1C structure has been illustrated as an example, but the pixel PX may include a larger number of transistors or capacitors in other embodiments. A description thereof will be omitted.

Figure 5:
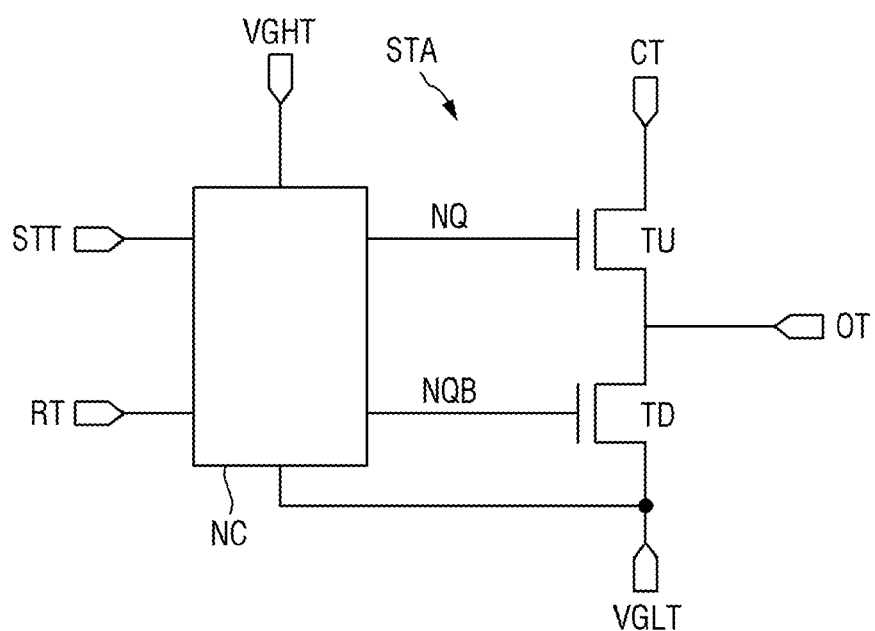
FIG. 5 is a circuit diagram illustrating an example of a scan driving circuit of FIG. 2.

FIG. 5 is a circuit diagram illustrating an example of the scan driving circuit of FIG. 2.

Referring to FIG. 5, the scan driving circuit 30 may include stages STA that are dependently connected, as shown in FIG. 5, and the stages STA may sequentially output scan signals to the scan lines SL (e.g., via an output terminal TO).

As shown in FIG. 5, each of the stages STA includes a pull-up node NQ, a pull-down node NQB, a pull-up transistor TU, which is turned on when the pull-up node NQ has a gate-on voltage, a pull-down transistor TD, which is turned on when the pull-down node NQB has a gate-on voltage, and a node controller NC for controlling the charge and discharge of the pull-up node NQ and/or the pull-down node NQB.

The node controller NC may be connected to a start terminal STT to which a start signal, or an output signal of a previous stage, is inputted, to a reset terminal RT to which an output signal of a next stage is inputted, to a gate-on voltage terminal VGHT to which a gate-on voltage is applied, and no a gate-off voltage terminal VGLT to which a gate-off voltage is applied.

The node controller NC controls the charge and discharge of the pull-up node NQ and of the pull-down node NQB according to a start signal inputted to the start terminal STT or to an output signal of a previous stage. To stably control the output of the stage STA, the node controller NC causes the pull-down node NQB to have a gate-off voltage when the pull-up node NQ has a gate-on voltage, and causes the pull-up node NQ to have a gate-off voltage when the pull-down node NQB has a gate-on voltage. To this end, the node controller NC may include a plurality of transistors.

The pull-up transistor TU is turned on when the stage STA is pulled up (e.g., when the pull-up node NQ has a gate-on voltage), and outputs a clock signal, which is inputted to a clock terminal CT, to an output terminal OT. The pull-down transistor TD is turned on when the stage STA is pulled down (e.g., when the pull-down node NQB has a gate-on voltage), and outputs the gate-off voltage of the gate-off voltage terminal VGLT to the output terminal OT.

The plurality of transistors of the node controller NC, the pull-up transistor TU, and the pull-down transistor TD of the stage STA may be formed as thin film transistors. Further, although FIG. 5 illustrates that the plurality of transistors of the node controller NC, the pull-up transistor TU, and the pull-down transistor TD of the stage STA are formed as N-type semiconductor transistors having N-type semiconductor characteristics, embodiments of the present disclosure are not limited thereto. That is, the plurality of transistors of the node controller NC, the pull-up transistor TU, and the pull-down transistor TD of the stage STA may be formed as P-type semiconductor transistors having P-type semiconductor characteristics.

Figure 6:
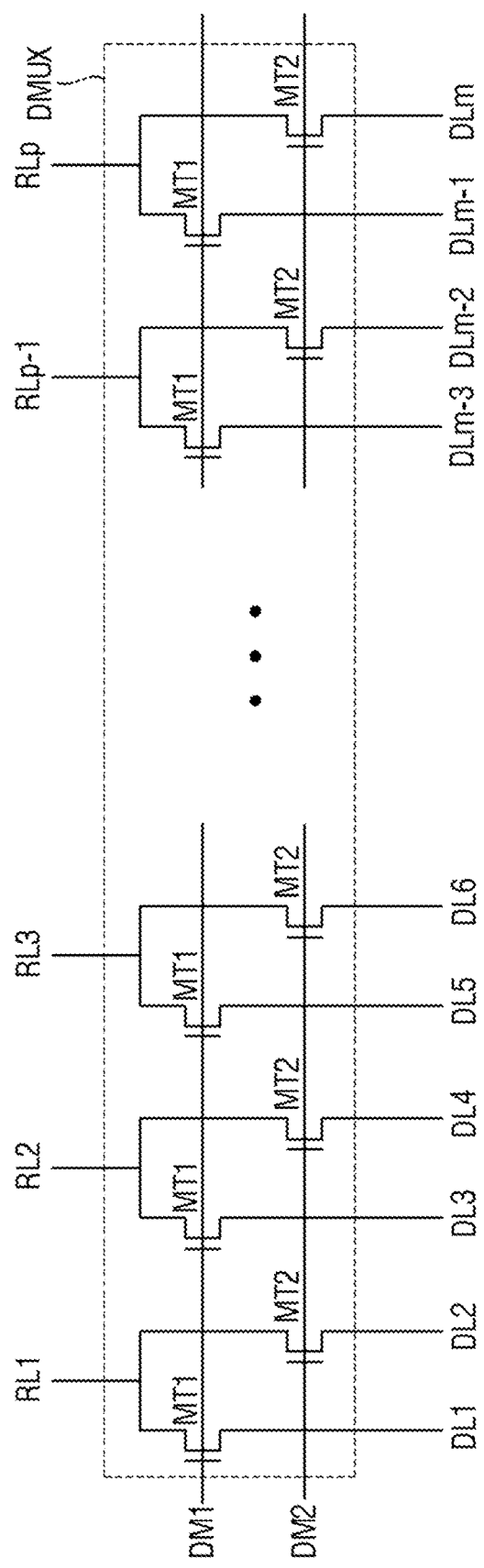
FIG. 6 is a circuit diagram illustrating an example of a data voltage distribution circuit of FIG. 2.

FIG. 6 is a circuit diagram illustrating an example of the data voltage distribution circuit of FIG. 2.

Referring to FIG. 6, the data voltage distribution circuit DMUX may time-divide the data voltages supplied to routing lines RL1 to RLp (p is an integer of 2 or more), and may distribute the data voltages to a plurality of data lines DL1 to DLm (for example, m is an integer satisfying m=2p) by using respective distribution transistors MT1 and MT2, which are respectively sequentially turned on by distribution control signals supplied to distribution control lines DM1 and DM2. Although FIG. 6 illustrates that the data voltage distribution circuit DMUX time-divides the data voltages supplied to one routing line, and distributes the data voltages to two data lines, embodiments of the present disclosure are not limited thereto.

The data voltage distribution circuit DMUX may include first distribution transistors MT1 and second distribution transistors MT2. The gate electrode of each of the first distribution transistors MT1 may be connected to the first distribution control line DM1, and the gate electrode of each of the second distribution transistors MT2 may be connected to the second distribution control line DM2.

The first distribution transistor MT1 and the second distribution transistor MT2 connected to one routing line may be connected to different data lines. For example, the first distribution transistor MT1 connected to the first routing line RL1 may be connected to the first data line DL1, and the second distribution transistor MT2 connected to the first routing line RL1 may be connected to the second data line DL2. The first distribution transistor MT1 connected to the $p^{th}$ routing line RLp may be connected to the $(m-1)^{th}$ data line DLm-1, and the second distribution transistor MT2 connected to the $p^{th}$ routing line RLp may be connected to the $m^{th}$ data line DLm.

When the first distribution control signal having the gate-on voltage is applied to the first distribution control line DM1, the first distribution transistors MT1 may be turned on. Accordingly, the routing lines RL1 to RLp may be respectively connected to the odd-numbered data lines DL1, DL3, DL5, . . . , DLm-1. When the second distribution control signal having the gate-on voltage is applied to the second distribution control line DM2, the second distribution transistors MT2 may be turned on. Accordingly, the routing lines RL1 to RLp may be respectively connected to the even-numbered data lines DL2, DL4, DL6, . . . , DLm. Thus, the data voltage distribution circuit DMUX may time-divide the data voltages supplied to the routing lines RL1 to RLp (p is an integer of 2 or more), and may distribute the data voltages to the plurality of data lines DL1 to DLm (m is an integer satisfying m=2p).

The first distribution transistors MT1 and the second distribution transistors MT2 of the data voltage distribution circuit DMUX may be formed as thin film transistors. Although FIG. 6 illustrates that the first distribution transistors MT1 and the second distribution transistors MT2 of the data voltage distribution circuit DMUX are formed as N-type semiconductor transistors having N-type semiconductor characteristics, embodiments of the present disclosure are not limited thereto. That is, the first distribution transistors MT1 and the second distribution transistors MT2 of the data voltage distribution circuit DMUX may be formed as P-type semiconductor transistors having P-type semiconductor characteristics.

Hereinafter, the structure and arrangement of the transistors located in each pixel PX will be described.

Figure 7:
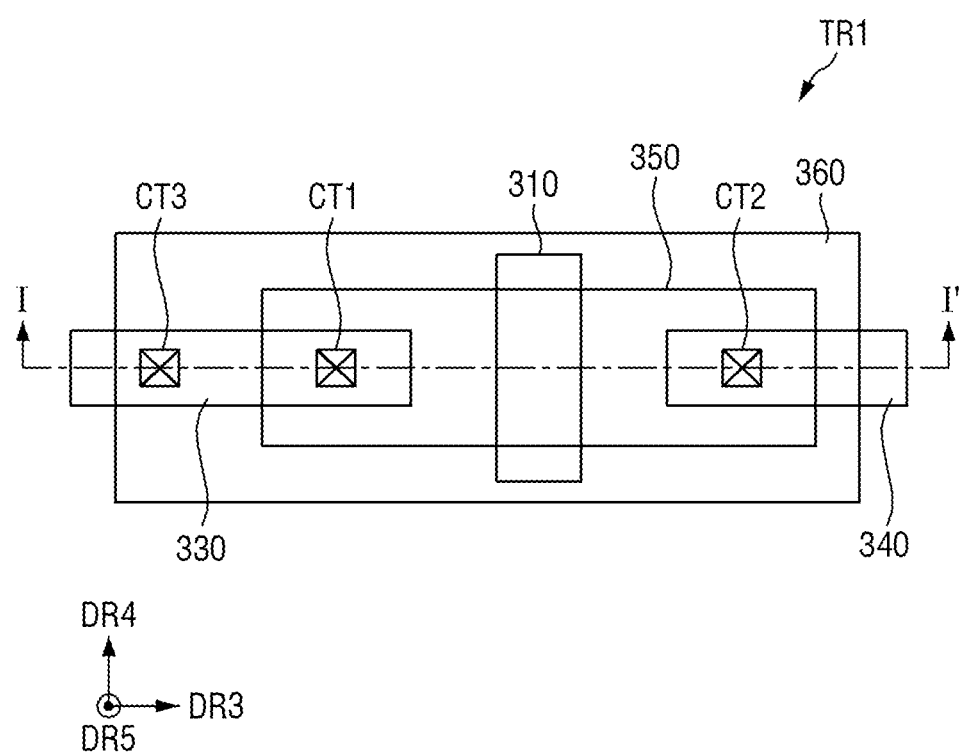
FIG. 7 is a plan view illustrating a first transistor according to some embodiments.
Figure 8:
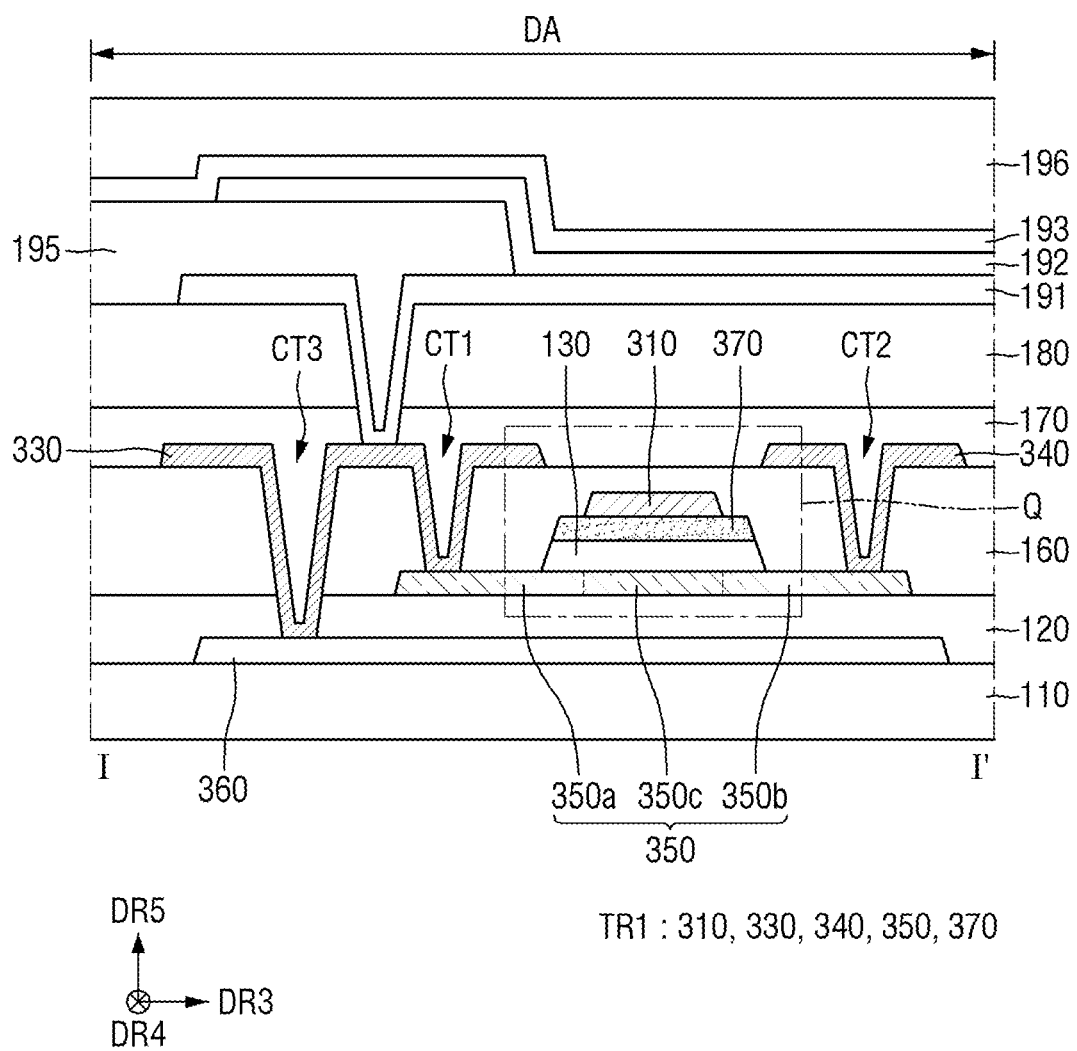
FIG. 8 is a cross-sectional view taken along the line I-I' of FIG. 7.
Figure 9:
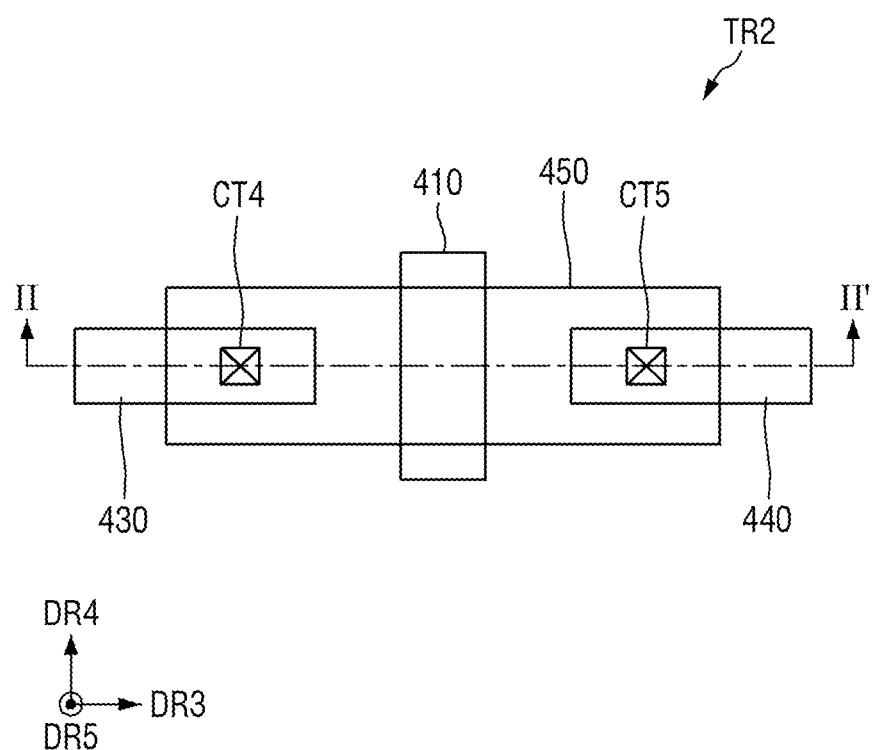
FIG. 9 is a plan view of a second transistor according to some embodiments.
Figure 10:
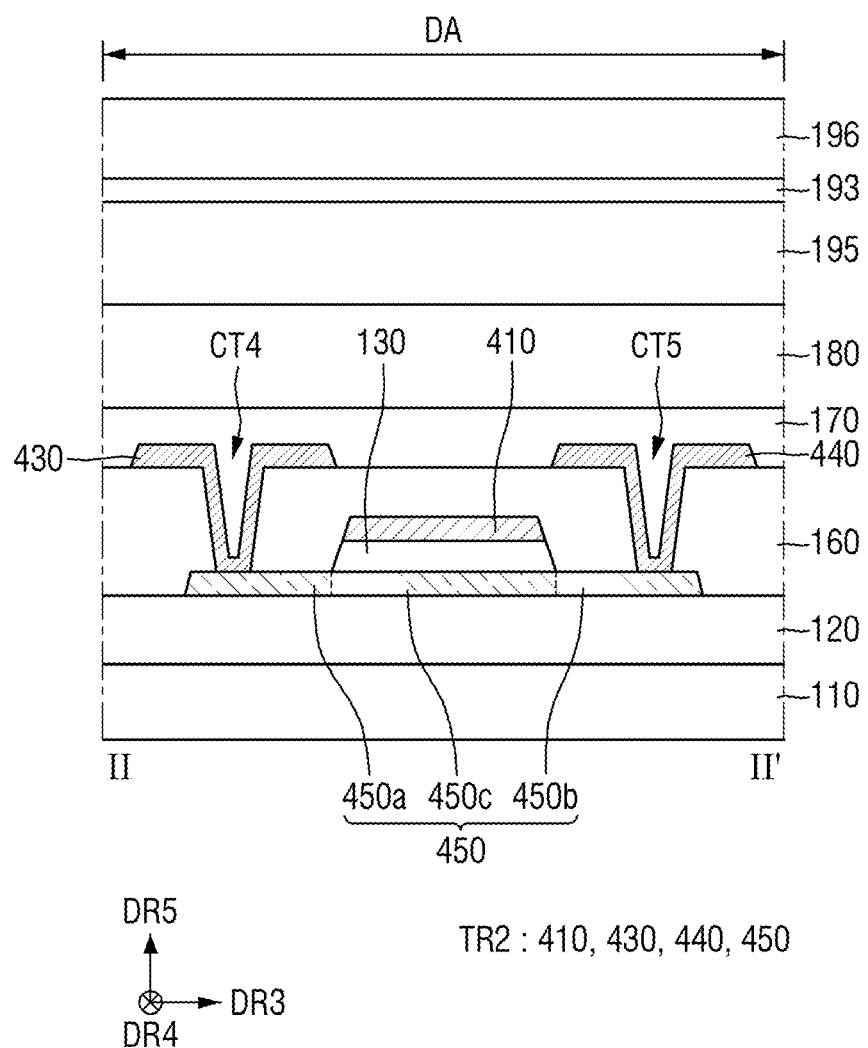
FIG. 10 is a cross-sectional view taken along the line II-II' of FIG. 9

FIG. 7 is a plan view illustrating a first transistor according to some embodiments. FIG. 8 is a cross-sectional view taken along the line I-I' of FIG. 7. FIG. 9 is a plan view of a second transistor according to some embodiments. FIG. 10 is a cross-sectional view taken along the line II-II' of FIG. 9.

FIGS. 7 to 10 illustrate that the driving transistor of the pixel PX and the first transistor TR1 and the second transistor TR2, which are switching transistors, are formed in a coplanar structure. The coplanar structure has a top-gate structure in which a gate electrode is formed above an active layer. However, the present disclosure is not limited thereto, and the first transistor TR1 and the second transistor TR2 of each pixel PX may have a bottom-gate structure in which a gate electrode is formed below an active layer.

Referring to FIGS. 7 to 10, the display panel 10 includes a first substrate 110, a buffer layer 120, a first gate insulating layer 130, a first transistor TR1, a second transistor TR2, a first interlayer insulating layer 160, a first passivation layer 170, a first planarization layer 180, a first electrode 191, an organic light emitting layer 192, a second electrode 193, a pixel defining layer 195, and an encapsulation layer 196, which are located in the display area DA.

According to some embodiments, the first transistor TR1 of each pixel PX includes a first gate electrode 310, a first active layer 350, a first oxide layer 370, a first source electrode 330, a first drain electrode 340, and a first light blocking layer 360. The second transistor TR2 of the pixel PX includes a second gate electrode 410, a second active layer 450, a second source electrode 430, and a second drain electrode 440.

The first substrate 110 may provide a region where the first transistor TR1 and the second transistor TR2 are formed. The first substrate 110 may be made of plastic or glass.

The first light blocking layer 360 may be located on the first substrate 110. The first light blocking layer 360 may block light from being incident on the first active layer 350 from the first substrate 110. The first light blocking layer 360 can reduce or prevent a leakage current flowing in the first active layer 350 when light from the first substrate 110 is incident on the first active layer 350. The length of the first light blocking layer 360 in a third direction DR3 and the length of the first light blocking layer 360 in a fourth direction DR4 may be longer than the length of the first active layer 350 in the third direction DR3 and the length of the first active layer 350 in the fourth direction DR4 (e.g., respectively). The first light blocking layer 360 may be formed as a single layer or as multiple layers made of any one or more of molybdenum (Mo), aluminum (Al), chromium (Cr), gold (Au), titanium (Ti), nickel (Ni), neodymium (Nd), and/or copper (Cu) and/or an alloy thereof.

The buffer layer 120 may be located on the first light blocking layer 360. The buffer layer 120 may protect the first transistor TR1 and the second transistor TR2 of the pixel PX from moisture penetrating through the first substrate 110. The buffer layer 120 may include a plurality of alternately stacked inorganic layers. For example, the buffer layer 120 may be formed of multiple layers in which one or more inorganic layers of a silicon oxide (SiOx) layer, a silicon nitride (SiNx) layer, and a silicon oxynitride (SiON) layer are alternately stacked.

The first active layer 350 and the second active layer 450 may be located on the buffer layer 120. According to some embodiments, the first active layer 350 and the second active layer 450 may have an oxide semiconductor. In some embodiments, the first active layer 350 and the second active layer 450 may include indium-tin oxide (ITO), indium-tin-gallium oxide (ITGO), indium-gallium-zinc oxide (IGZO), and/or indium-gallium-zinc-tin oxide (IGZTO). However, the present disclosure is not limited thereto.

The first active layer 350 and the second active layer 450 may include first conducting regions 350a and 450a, second conducting regions 350b and 450b, and channel regions 350c and 450c, respectively. The channel regions 350c and 450c may be located between the first conducting regions 350a and 450a and the second conducting regions 350b and 450b, respectively.

The first gate insulating layer 130 is located on the first active layer 350 and the second active layer 450. The first gate insulating layer 130 may be formed of an inorganic material, such as silicon oxide (SiOx), silicon nitride (SiNx), or a stacked structure thereof.

The first gate electrode 310 and the second gate electrode 410 are located on the first gate insulating layer 130. The first gate electrode 310 may overlap the first active layer 350 with the first gate insulating layer 130 interposed therebetween, and the second gate electrode 410 may overlap the second active layer 450 with the first gate insulating layer 130 interposed therebetween. For example, the first gate electrode 310 may overlap the channel region 350c of the first active layer 350, and the second gate electrode 410 may overlap the channel region 450c of the second active layer 450. The first gate electrode 310 and the second gate electrode 410 may be formed as a single layer or as multiple layers made of any one of molybdenum (Mo), aluminum (Al), chromium (Cr), gold (Au), titanium (Ti), nickel (Ni), neodymium (Nd), and/or copper (Cu) and/or an alloy thereof.

Meanwhile, although FIGS. 8 and 10 illustrate that the first gate insulating layer 130 is located only between the first gate electrode 310 and the first active layer 350 and between the second gate electrode 410 and the second active layer 450, embodiments of the present disclosure are not limited thereto. For example, the first gate insulating layer 130 may be formed on the upper and side surfaces of the first active layer 350 and the second active layer 450.

According to some embodiments, the first transistor TR1 may include the first oxide layer 370 located between the first gate insulating layer 130 and the first gate electrode 310. The first oxide layer 370 may be located to overlap at least the channel region 350c of the first active layer 350. The first oxide layer 370 may overlap the channel region 350c of the first active layer 350 to inject excess oxygen (O) thereto. In some embodiments, the width of the first oxide layer 370 measured in the third direction DR3 may be greater than the width of the channel region 350c measured in the third direction DR3.

An oxygen defect region may be partially formed in the first active layer 350 including the oxide semiconductor. The oxygen defect region may act as a factor that degrades the device characteristics of the first active layer 350. Further, when the first gate insulating layer 130 is located on the first active layer 350, hydrogen (H) from the first gate insulating layer 130 may penetrate into the oxygen defect region to form impurities.

The first oxide layer 370 according to some embodiments may supply the excess oxygen (O) to another adjacent layer (e.g., to the first gate insulating layer 130). The excess oxygen (O) supplied to the first gate insulating layer 130 may be injected into the channel region 350c of the first active layer 350 to reduce the number of oxygen defect regions formed in the first active layer 350.

When the first oxide layer 370 is located on the first gate insulating layer 130, the excess oxygen O is supplied to the first gate insulating layer 130, and it may be injected into the oxygen defect region of the first active layer 350. When the excess oxygen O is injected by the first oxide layer 370, the hydrogen (H) penetrated into the oxygen defect region is moved to the first gate insulating layer 130, and as the excess oxygen O is filled in the region, the concentration of the oxygen defect region may decrease.

According to some embodiments, the oxygen concentration of the first active layer 350 may be greater than the oxygen concentration of the first oxide layer 370. The first active layer 350 receives the excess oxygen (O) from the first oxide layer 370 located on the first gate insulating layer 130 to increase the oxygen concentration, and the concentration of the oxygen defect region may decrease. Accordingly, the first active layer 350 may have high mobility, and the transistor including the first oxide layer 370 may have improved electrical characteristics. In the display device 1 according to some embodiments, in each pixel PX of the display panel 10, the first transistor TR1, which is a driving transistor, includes the first oxide layer 370 located between the first active layer 350 and the first gate electrode 310. Accordingly, the driving transistor may have improved electrical characteristics.

The first oxide layer 370 according to some embodiments may be a crystalline oxide containing tin (Sn). In some embodiments, the first oxide layer 370 may be formed of tin-zinc oxide (TZO), tin-gallium oxide (TGO), indium-tin-zinc oxide (ITZO), indium-tin-gallium oxide (ITGO), and/ and/or indium-tin-zinc-gallium oxide (ITZGO). However, the present disclosure is not limited thereto, and the first oxide layer 370 may be formed of an oxide including tin (Sn) other than the above-described oxide. That is, the first oxide layer 370 may be an oxide having a content of tin (Sn) in a range of about 1 at. % to about 100 at. % with respect to the total cation content.

During the process of fabricating the display device 1, the first oxide layer 370 may be formed on the first gate insulating layer 130 through an etching process. When the first oxide layer 370 does not have a crystalline oxide, the first gate electrode 310 and the first oxide layer 370 may be concurrently or substantially simultaneously etched in one process.

When the first oxide layer 370 is removed in the same etching process as the first gate electrode 310, the side surface of the first oxide layer 370 may be etched more than the side surface of the first gate electrode 310, and an undercut may occur. As the first oxide layer 370 is etched more than the first gate electrode 310, when the side surface of the first oxide layer 370 is recessed inwardly, an insulating material of the first interlayer insulating layer 160 formed in a subsequent process may not be deposited on the side surface of the first oxide layer 370. Accordingly, a defect (crack) in which an insulating material is not correctly deposited may occur in the first interlayer insulating layer 160 along the undercut formed in the first oxide layer 370, which may reduce device characteristics and reliability of the first transistor TR1.

The first oxide layer 370 according to some embodiments may include a crystalline oxide containing tin (Sn), and may be formed through an etching process that is different from that of the first gate electrode 310.

Figure 11:
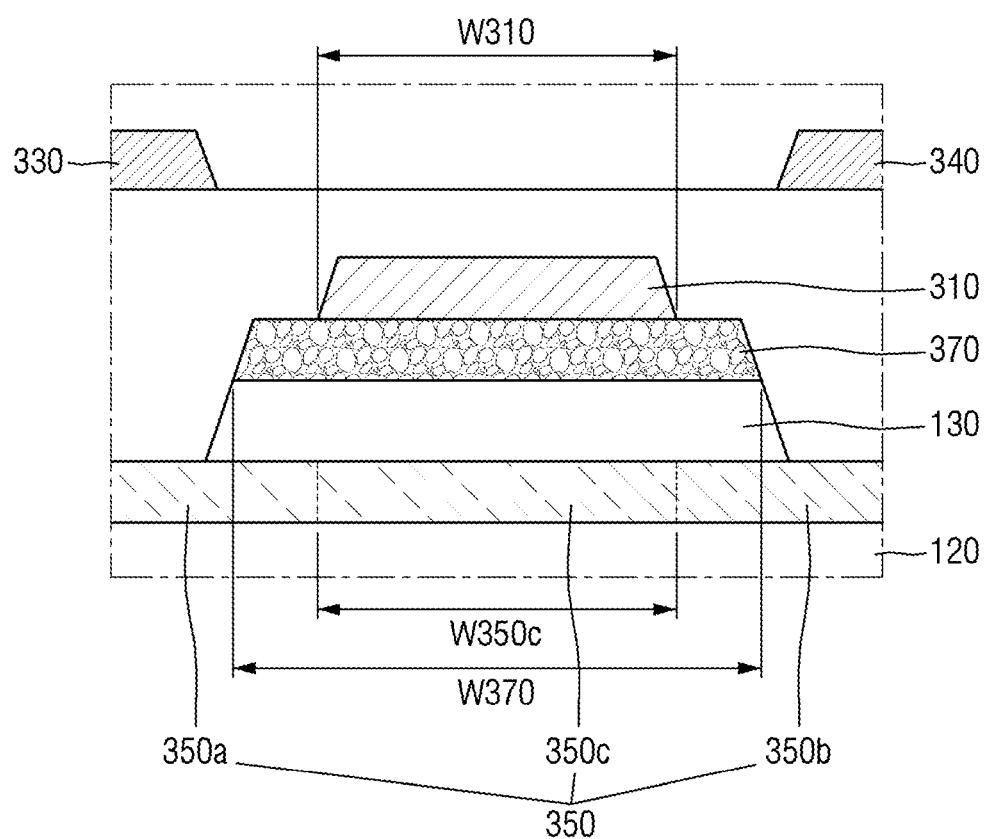
FIG. 11 is an enlarged view of the portion Q of FIG. 8.

FIG. 11 is an enlarged view of the portion Q of FIG. 8.

Referring to FIG. 11, the first oxide layer 370 may include a crystalline oxide containing tin (Sn), and may be formed through an etching process that is different from an etching process for forming the first gate electrode 310. Accordingly, it is possible to reduce or prevent the likelihood of an undercut phenomenon, which may occur when the first oxide layer 370 is etched more than the first gate electrode 310, and it is possible to reduce or minimize the likelihood of a crack of the first interlayer insulating layer 160. Furthermore, it is possible to improve device characteristics by securing structural stability of the first transistor TR1.

Meanwhile, as the first gate electrode 310 and the first oxide layer 370 are formed through different etching processes, the first oxide layer 370 may have a greater width than the first gate electrode 310. According to some embodiments, a width W370 of the first oxide layer 370 measured in one direction (e.g., in the third direction DR3), may be greater than a width W310 of the first gate electrode 310 measured in that direction. At least one end of the first oxide layer 370 may be formed to protrude more than one end of the first gate electrode 310. The first gate electrode 310 is located on the first oxide layer 370, and as the first gate electrode 310 has a narrower width, at least a portion of the upper surface of the first oxide layer 370 may be exposed. The exposed upper surface of the first oxide layer 370 may be in contact with the first interlayer insulating layer 160.

In the etching process for forming the first gate electrode 310, the oxide layer having a crystalline oxide is not etched. During the process of fabricating the display device 1, an etching process for forming the first oxide layer 370 may be performed after the first gate electrode 310 is formed. As described later, a photoresist PR (see FIG. 20) may be formed on the first gate electrode 310 for forming the first oxide layer 370. Because the photoresist PR is formed to have a greater width than the first gate electrode 310, the first oxide layer 370 having a width substantially the same as that of the photoresist PR may have a greater width than the first gate electrode 310. Because the width W370 of the first oxide layer 370 is greater than the width W310 of the first gate electrode 310, an undercut of the first oxide layer 370 can be prevented.

In addition, according to some embodiments, the width W370 of the first oxide layer 370 may be greater than the width W350c of the channel region 350c of the first active layer 350. As described above, the first oxide layer 370 may be located on the first active layer 350 to inject the excess oxygen (O) into the first active layer 350. To this end, the first oxide layer 370 may be formed to overlap at least the channel region 350c of the first active layer 350. Because the first oxide layer 370 located on the first gate insulating layer 130 has the width W370 which is greater than the width W350c of the channel region 350c of the first active layer 350, it may be located to overlap the entire area of the channel region 350c. Accordingly, at least a portion of the first oxide layer 370 may also overlap a first conducting region 350a and a second conducting region 350b of the first active layer 350. However, the present disclosure is not limited thereto, and the width W370 of the first oxide layer 370 may be substantially the same as the width W350c of the channel region 350c in some embodiments.

Figure 12:
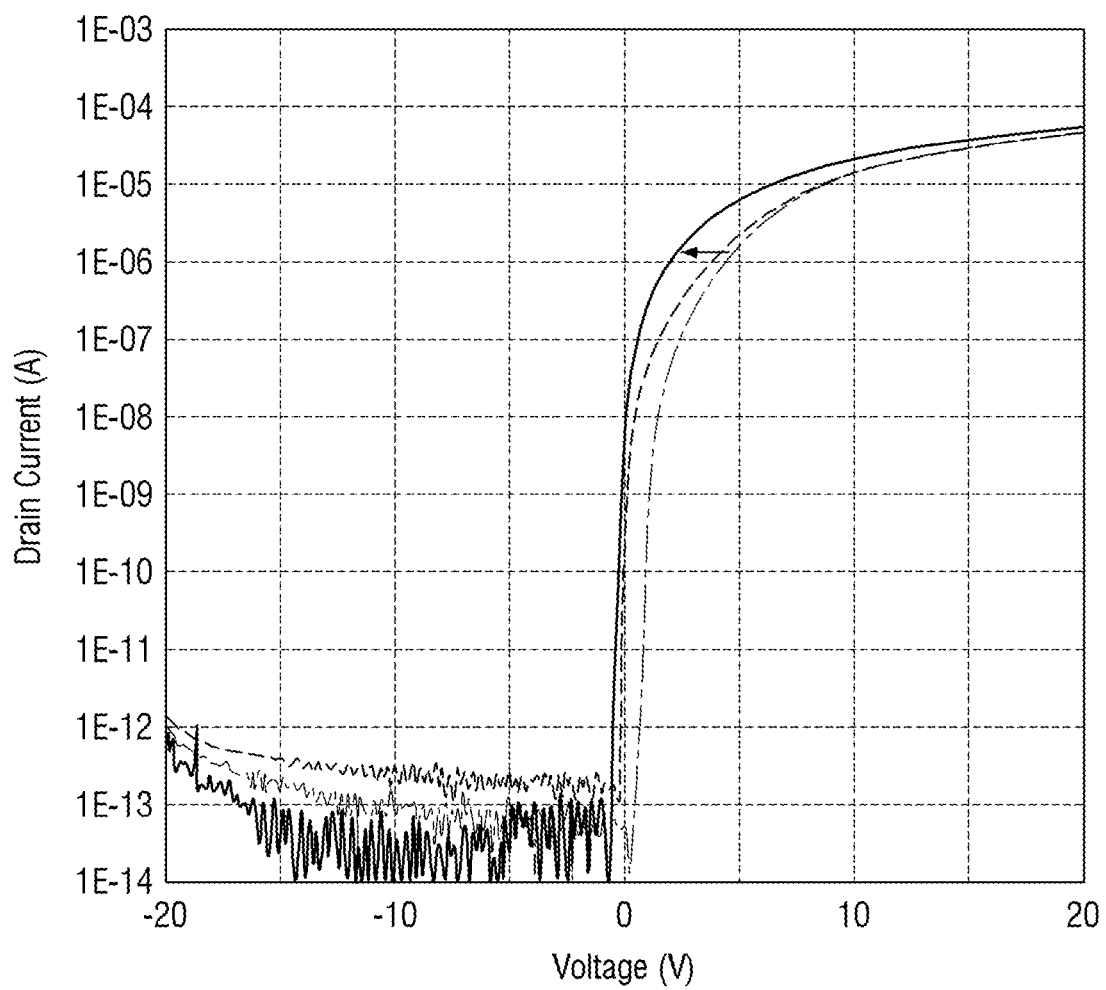
FIG. 12 is a graph showing a driving current according to a gate voltage of a first transistor according to some embodiments.

FIG. 12 is a graph showing a driving current according to a gate voltage of a first transistor according to some embodiments. FIG. 12 is a graph illustrating a driving current A according to a gate voltage V of the first transistor TR1, which is a driving transistor. In FIG. 12, by varying the gate voltage V of the first transistor TR1 several times, a change in the driving current A was measured. In FIG. 12, a dotted line represents a change in the driving current A according to a change in the gate voltage V of the first transistor TR1 including an oxide layer which does not have a crystalline phase according to other embodiments, and a solid line represents a change in the driving current A according to a change in the gate voltage V of the first transistor TR1 including the first oxide layer 370 having a crystalline oxide according to some embodiments.

As described above, the first transistor TR1 constituting the driving transistor of the display device 1 includes the first oxide layer 370, thereby improving the electrical characteristics of the device. Also, the first oxide layer 370 has a crystalline oxide, thereby ensuring excellent device reliability.

Referring to FIG. 12, it can be seen that when the first oxide layer 370 does not have a crystalline oxide (dotted line in FIG. 12), the value of the driving current A changes as the change of the gate voltage V is repeated several times. As described above, when the first oxide layer 370 does not have a crystalline oxide, an undercut may occur below the first gate electrode 310, and a crack may occur in the first interlayer insulating layer 160 due to an undercut of the first oxide layer 370. The crack formed in the first interlayer insulating layer 160 may cause a structural defect of the first transistor TR1 to cause difficulty in securing device characteristics. Accordingly, a non-constant driving current A may flow while the change in the gate voltage V is repeated several times, and the device may have low reliability.

On the other hand, when the first oxide layer 370 has a crystalline oxide (solid line in FIG. 12), because an undercut does not occur below the first gate electrode 310, it is possible to prevent the occurrence of a crack of the first interlayer insulating layer 160. Accordingly, it is possible to reduce structural defects of the first transistor TR1, and to ensure excellent device characteristics. As shown in FIG. 12, in the first transistor TR1 according to some embodiments, a constant driving current A may flow even though the change of the gate voltage V is repeated several times, and the device may have excellent reliability.

Referring again to FIGS. 7 to 10, the first interlayer insulating layer 160 is located on the first gate electrode 310 and the second gate electrode 410. The first interlayer insulating layer 160 may be formed of an inorganic material, such as silicon oxide (SiOx), silicon nitride (SiNx), or a stacked structure thereof.

The first interlayer insulating layer 160 may include a first contact hole CT1 passing therethrough to expose a portion of the upper surface of the first active layer 350, and may also include a second contact hole CT2 passing therethrough to expose another portion of the upper surface of the first active layer 350. That is, the first contact hole CT1 may be formed to expose the first conducting region 350a of the first active layer 350, and the second contact hole CT2 may be formed to expose the second conducting region 350b of the first active layer 350. Further, a third contact hole CT3 may be formed in the first interlayer insulating layer 160 and in the buffer layer 120 to pass therethrough to expose the first light blocking layer 360.

Further, the first interlayer insulating layer 160 may include a fourth contact hole CT4 passing therethrough to expose a portion of the upper surface of the second active layer 450, and may also include a fifth contact hole CT5 passing therethrough to expose another portion of the upper surface of the second active layer 450. That is, the fourth contact hole CT4 may be formed to expose the first conducting region 450a of the second active layer 450, and the fifth contact hole CT5 may be formed to expose the second conducting region 450b of the second active layer 450.

The first source electrode 330 and the first drain electrode 340 of the first transistor TR1, and the second source electrode 430 and the second drain electrode 440 of the second transistor TR2, are located on the first interlayer insulating layer 160.

The first source electrode 330 is in contact with the first conducting region 350a formed on one side of the first active layer 350 through the first contact hole CT1. The first drain electrode 340 is in contact with the second conducting region 350b formed on the other side of the first active layer 350 through the second contact hole CT2.

The second source electrode 430 is in contact with the first conducting region 450a formed on one side of the second active layer 450 through the fourth contact hole CT4. The second drain electrode 440 is in contact with the second conducting region 450b formed on the other side of the second active layer 450 through the fifth contact hole CT5.

The first passivation layer 170 is located on the source electrodes 330 and 430 and the drain electrodes 340 and 440 of the first transistor TR1 and the second transistor TR2. The first passivation layer 170 may be formed of an inorganic material, such as silicon oxide (SiOx), silicon nitride (SiNx), or a stacked structure thereof.

The first planarization layer 180 is located on the first passivation layer 170. The first planarization layer 180 may planarize a step due to the thin film transistor such as the first transistor TR1 and the second transistor TR2. The first planarization layer 180 may be formed of an organic layer, such as acryl resin, epoxy resin, phenolic resin, polyamide resin, polyimide resin, and the like.

The light emitting element EL including the first electrode 191, the organic light emitting layer 192, and the second electrode 193, and also the pixel defining layer 195, may be formed on the first planarization layer 180.

The first electrode 191 may be formed on the first planarization layer 180. The first electrode 191 may be connected to the first source electrode 330 of the first transistor TR1 through a contact hole CNT passing through the first passivation layer 170 and the first planarization layer 180.

The pixel defining layer 195 may be formed to cover the edge of the first electrode 191 on the first planarization layer 180 to partition the pixels. That is, the pixel defining layer 195 serves to define, or demarcate, pixels. Each of the pixels represents a region where the first electrode 191, the organic light emitting layer 192, and the second electrode 193 are stacked sequentially, and where holes from the first electrode 191 and electrons from the second electrode 193 are coupled to each other in the organic light emitting layer 192 to emit light.

The organic light emitting layer 192 may be located on the first electrode 191 and the pixel defining layer 195. The organic light emitting layer 192 may include a hole transporting layer, a light emitting layer, and an electron transporting layer. In addition, the organic light emitting layer 192 may be formed in a tandem structure of two or more stacks, in which case a charge generating layer may be formed between the stacks.

The second electrode 193 may be formed on the organic light emitting layer 192. The second electrode 193 may be a common layer formed commonly to the pixels.

The light emitting elements EL may be formed of a top emission type that emits light in an upward direction. In this case, the first electrode 191 may be formed of a metal material having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu). Further, the second electrode 193 may be formed of a transparent conductive material (TCO) such as ITO or IZO that can transmit light or a semi-transmissive conductive material, such as magnesium (Mg), silver (Ag), or an alloy of magnesium (Mg) and silver (Ag). When the second electrode 193 is formed of a semi-transmissive conductive material, the light emission efficiency can be improved due to a micro-cavity effect.

The encapsulation layer 196 may be formed on the second electrode 193 to reduce or prevent permeation of oxygen or moisture. The encapsulation layer 196 may include at least one inorganic layer. The inorganic layer may be formed of silicon nitride, aluminum nitride, zirconium nitride, titanium nitride, hafnium nitride, tantalum nitride, silicon oxide, aluminum oxide, and/or titanium oxide. Further, the encapsulation layer 196 may include at least one organic layer to reduce or prevent particles from penetrating the encapsulation layer 196 and entering the organic light emitting layer 192 and the second electrode 193. The organic layer may be formed of epoxy, acrylate or urethane acrylate.

Meanwhile, each of the plurality of transistors of the node controller NC, the pull-up transistor TU, and the pull-down transistor TD of the scan driving circuit 30 may be formed to be substantially the same as the second transistor TR2 illustrated in FIGS. 9 and 10. That is, in the pull-up transistor TU and the pull-down transistor TD of the scan driving circuit 30, an oxide layer having a crystalline oxide may not be located between the active layer and the gate electrode. In this case, the third gate electrode, the third active layer, the third source electrode, and the third drain electrode of each of the plurality of transistors of the node controller NC, the pull-up transistor TU, and the pull-down transistor TD of the scan driving circuit 30 are substantially the same as the second gate electrode 410, the second active layer 450, the second source electrode 430, and the second drain electrode 440 of the second transistor TR2 described above with reference to FIGS. 9 and 10, and thus, a repeated detailed description thereof will be omitted.

In addition, each of the first and second distribution transistors MT1 and MT2 of the data voltage distribution circuit DMUX may be formed to be substantially the same as the second transistor TR2 shown in FIGS. 9 and 10. That is, in each of the first and second distribution transistors MT1 and MT2 of the data voltage distribution circuit DMUX, an oxide layer having a crystalline oxide may be omitted from between the active layer and the gate electrode. In this case, the fourth gate electrode, the fourth active layer, the fourth source electrode, and the fourth drain electrode of each of the first and second distribution transistors MT1 and MT2 of the data voltage distribution circuit DMUX are substantially the same as the second gate electrode 410, the second active layer 450, the second source electrode 430, and the second drain electrode 440 of the second transistor TR2 described above with reference to FIGS. 9 and 10, and thus, a repeated detailed description thereof will be omitted.

Figure 13:
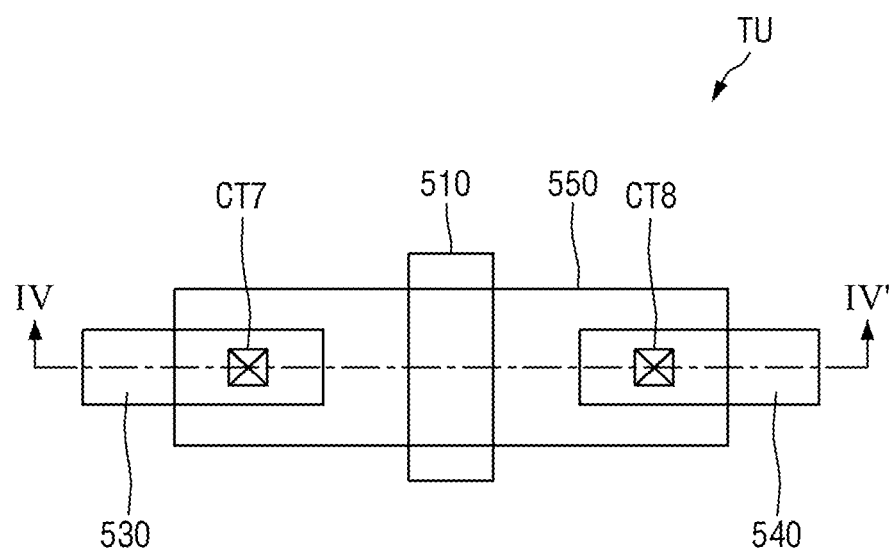
FIG. 13 is a plan view illustrating an example of a pull-up transistor of the scan driving circuit of FIG. 2.
Figure 14:
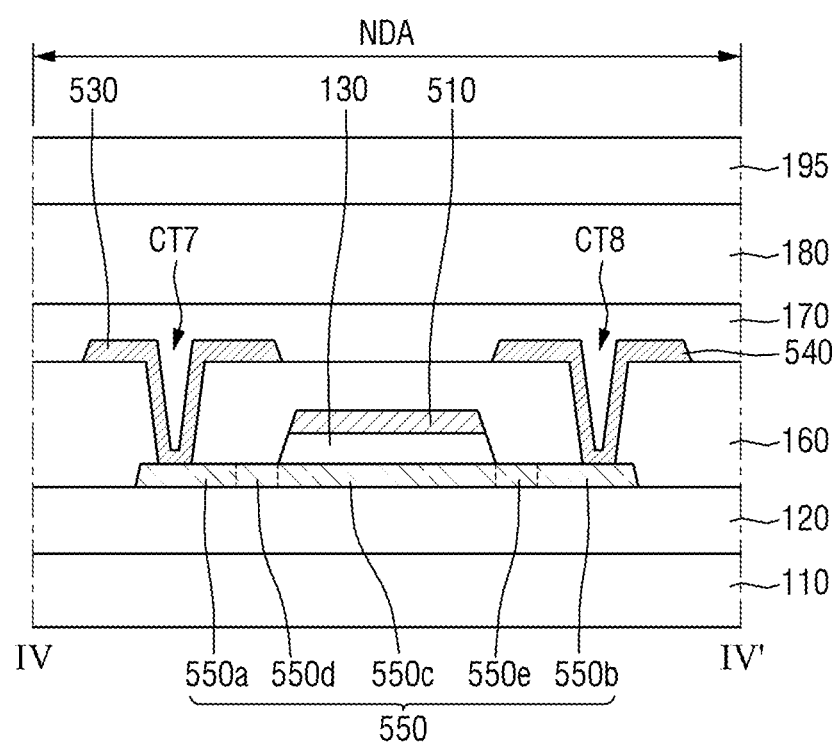
FIG. 14 is a cross-sectional view illustrating an example taken along the line IV-IV' of FIG. 13.

FIG. 13 is a plan view illustrating an example of a pull-up transistor of the scan driving circuit of FIG. 2. FIG. 14 is a cross-sectional view illustrating an example taken along the line IV-IV' of FIG. 13.

The embodiment of FIGS. 13 and 14 has a difference in that a third active layer 550 of the pull-up transistor TU of the scan driving circuit 30 includes polycrystalline silicon.

Referring to FIGS. 13 and 14, the pull-up transistor TU of the scan driving circuit 30 includes a third gate electrode 510, a third active layer 550, a third source electrode 530, and a third drain electrode 540.

The third active layer 550 may be located on the buffer layer 120 and may include polycrystalline silicon. The third active layer 550 may include a first high concentration doped region 550a, a second high concentration doped region 550b, a channel region 550c, a first low concentration doped region 550d, and a second low concentration doped region 550e. The channel region 550c may be formed of polycrystalline silicon that is not doped with impurities. The first high concentration doped region 550a and the second high concentration doped region 550b may be formed of polycrystalline silicon doped with high concentration impurities. The first low concentration doped region 550d and the second low concentration doped region 550e may be formed of polycrystalline silicon doped with low concentration impurities.

The first gate insulating layer 130 is located on the third active layer 550. The description of the first gate insulating layer 130 is the same as described above with reference to FIGS. 7 to 10.

The third gate electrode 510 is located on the first gate insulating layer 130. The third gate electrode 510 may overlap the third active layer 550 with the first gate insulating layer 130 interposed therebetween. For example, the third gate electrode 510 may overlap the channel region 550c of the third active layer 550. In addition, the description of the third gate electrode 510 is the same as described above with reference to the first gate electrode 310 and the second gate electrode 410.

The first interlayer insulating layer 160 is located on the third gate electrode 510. The description of the first interlayer insulating layer 160 is the same as described above with reference to FIGS. 7 to 10.

The first interlayer insulating layer 160 may include a seventh contact hole CT7 passing through the first interlayer insulating layer 160 to expose a portion of the upper surface of the third active layer 550, and an eighth contact hole CT8 passing through the first interlayer insulating layer 160 to expose another portion of the upper surface of the third active layer 550. The seventh contact hole CT7 may be formed to expose the first high concentration doped region 550a of the third active layer 550, and the eighth contact hole CT8 may be formed to expose the second high concentration doped region 550b of the third active layer 550.

The third source electrode 530 and the third drain electrode 540 of the pull-up transistor TU are located on the first interlayer insulating layer 160.

The third source electrode 530 is in contact with the first high concentration doped region 550a formed on one side of the third active layer 550 through the seventh contact hole CT7. The third drain electrode 540 is in contact with the second high concentration doped region 550b formed on the other side of the third active layer 550 through the eighth contact hole CT8.

The first passivation layer 170 is located on the third source electrode 530 and the third drain electrode 540 of the pull-up transistor TU.

The first planarization layer 180 may be formed on the first passivation layer 170 to planarize a step due to the thin film transistor such as the pull-up transistor TU.

Meanwhile, each of the plurality of transistors of the node controller NC and the pull-down transistor TD of the scan driving circuit 30 may be formed to be substantially the same as the pull-up transistor TU shown in FIGS. 13 and 14.

Further, each of the first and second distribution transistors MT1 and MT2 of the data voltage distribution circuit DMUX may include a fourth gate electrode, a fourth active layer, a fourth source electrode, and a fourth drain electrode. Each of the first and second distribution transistors MT1 and MT2 of the data voltage distribution circuit DMUX may be formed to be substantially the same as the pull-up transistor TU of the scan driving circuit 30 shown in FIGS. 13 and 14. In this case, the fourth gate electrode, the fourth active layer, the fourth source electrode, and the fourth drain electrode of each of the first and second distribution transistors MT1 and MT2 of the data voltage distribution circuit DMUX are substantially the same as the third gate electrode 510, the third active layer 550, the third source electrode 530, and the third drain electrode 540 of the pull-up transistor TU described above with reference to FIGS. 13 and 14, and thus, a repeated detailed description thereof will be omitted.

Hereinafter, a method for fabricating the display device 1 including the first transistor TR1 and second transistor TR2 will be described.

Figure 15:
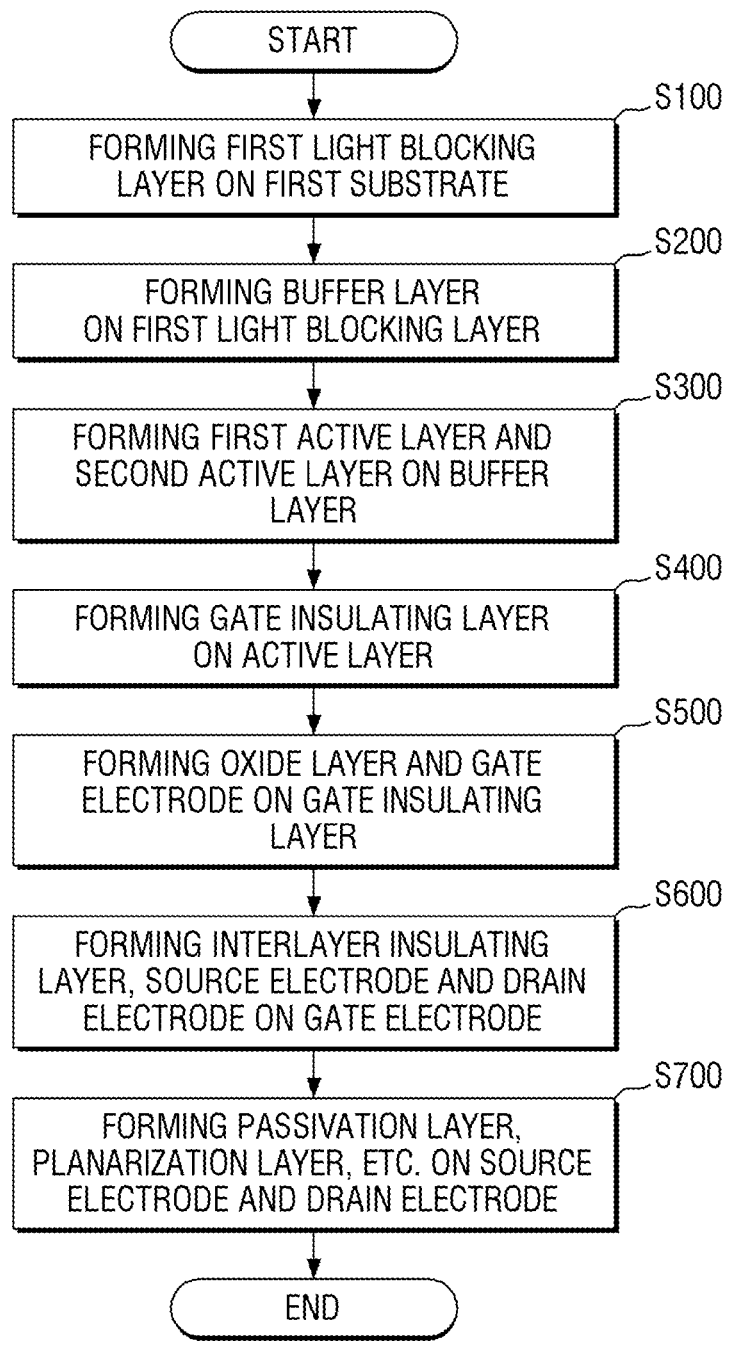
FIG. 15 is a flowchart showing a method for fabricating a display device according to some embodiments.
Figure 16:
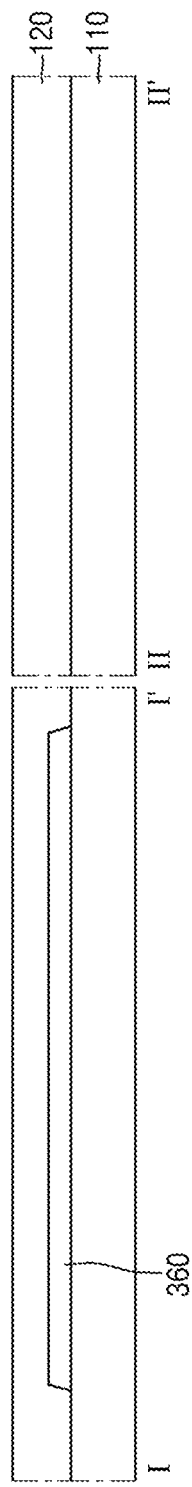
FIGS. 16 and 17 are cross-sectional views partially illustrating a method for fabricating a display device according to some embodiments.
Figure 17:
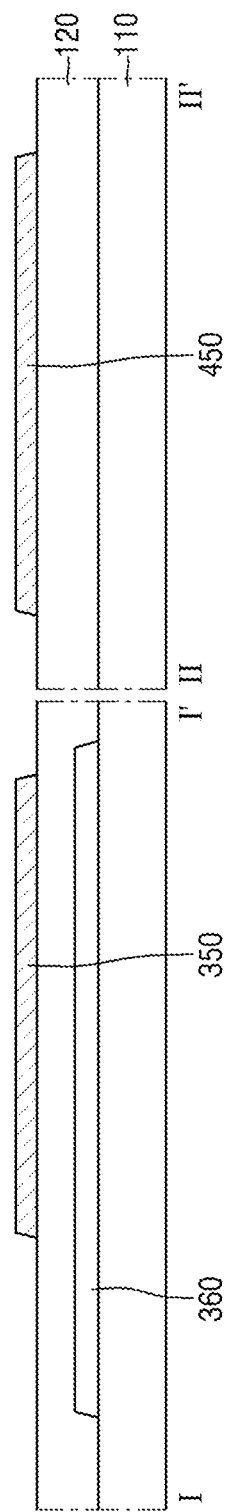
Figure 18:
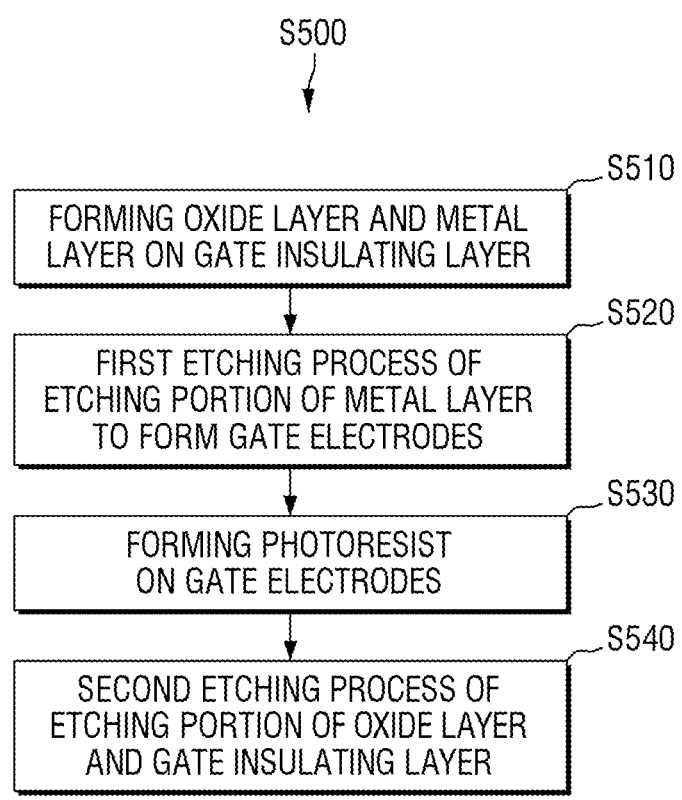
FIG. 18 is a flowchart illustrating a method of forming an oxide layer of a display device according to some embodiments.

FIG. 15 is a flowchart showing a method for fabricating a display device according to some embodiments. FIGS. 16 and 17 are cross-sectional views partially illustrating a method for fabricating a display device according to some embodiments. FIG. 18 is a flowchart illustrating a method of forming an oxide layer of a display device according to some embodiments. FIGS. 19 to 23 are cross-sectional views partially illustrating a method for fabricating a display device according to some embodiments.

A method for fabricating the display device 1 according to some embodiments may include forming an oxide layer and a gate electrode on a gate insulating layer formed on an active layer. As described above, the first oxide layer 370 of the first transistor TR1 includes a crystalline oxide containing tin (Sn), and may be formed through a different etching process from the first gate electrode 310.

Referring to FIGS. 15 to 23, first, as shown in FIG. 16, the first light blocking layer 360 is formed on the first substrate 110 (S100), and the buffer layer 120 is formed on the first light blocking layer 360 (S200). In an embodiment, the first light blocking layer 360 may be formed by patterning a light blocking metal layer, which is formed on the first substrate 110 by a sputtering method, by an etching process using a photoresist pattern. The buffer layer 120 may be formed by chemical vapor deposition. However, the present disclosure is not limited thereto.

Because the description of the first light blocking layer 360 and the buffer layer 120 is the same as described above, a repeated detailed description thereof will be omitted. However, as will be described later, a light blocking layer other than the first light blocking layer 360 may be further located on the first substrate 110. In this case, the other light blocking layer may be formed in the same process as the first light blocking layer 360.

Next, as shown in FIG. 17, the first active layer 350 and the second active layer 450 are formed on the buffer layer 120 (S300). The first active layer 350 and the second active layer 450 may be formed by a patterning process using a photoresist after one layer is formed by a sputtering method. However, the present disclosure is not limited thereto and, in some cases, they may be formed by atomic layer deposition.

Next, the first gate insulating layer 130, the first oxide layer 370, the first gate electrode 310, and the second gate electrode 320 are formed on the first active layer 350 and the second active layer 450.

According to some embodiments, the method for fabricating the display device 1 may include forming a gate electrode and an oxide layer by performing two etching processes. The gate electrode and the oxide layer may be formed, respectively, by partially etching and removing the metal layer constituting the gate electrode and the oxide layer. Here, the metal layer and the oxide layer may be partially removed through different etching processes.

As shown in FIG. 18, the process of forming the gate electrode and the oxide layer may include forming an oxide layer OXL and a metal layer MTL on the gate insulating layer (S510), performing a first etching process of etching a portion of the metal layer MTL to form the gate electrodes 310 and 410 (S520), forming a photoresist PR on the gate electrodes 310 and 410 (S530), and performing a second etching process of etching a portion of the oxide layer OXL and the first gate insulating layer 130 along the photoresist PR (S540).

The gate electrodes 310 and 410 may be formed through the first etching process of etching the metal layer MTL, and the first oxide layer 370 may be formed through the second etching process of etching the oxide layer OXL and the first gate insulating layer 130. Hereinafter, a process of forming the gate electrodes 310 and 410 and the first oxide layer 370 will be described in detail with reference to other drawings.

Meanwhile, in some embodiments, the first transistor TR1 may include the first oxide layer 370, but may not include the second transistor TR2. Accordingly, an etching process for forming the first oxide layer 370 may be performed on the first active layer 350, and might not be performed on the second active layer 450. However, the present disclosure is not limited thereto, and a case where the first oxide layer 370 is located on the first active layer 350, but is not located on the second active layer 450 will be described below by way of example.

Figure 19:
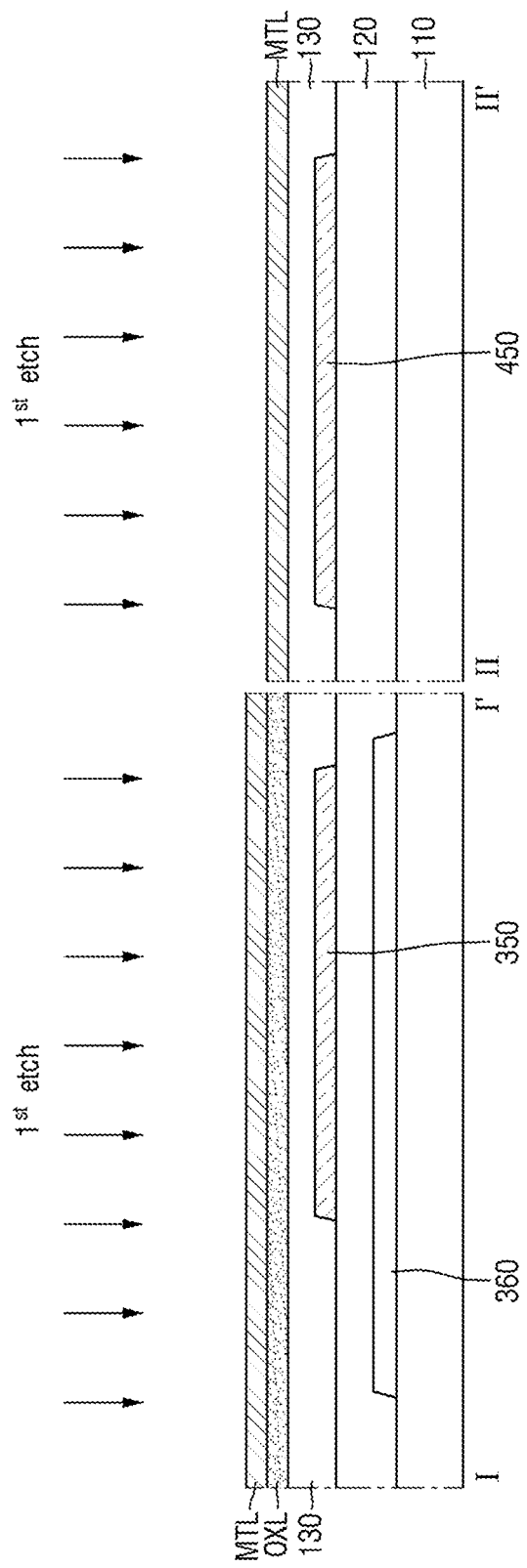
FIGS. 19 to 23 are cross-sectional views partially illustrating a method for fabricating a display device according to some embodiments.

First, as shown in FIG. 19, the first gate insulating layer 130 is formed on the active layers 350 and 450 (S400), and the oxide layer OXL and the metal layer MTL are formed on the first gate insulating layer 130 (S510). The first gate insulating layer 130, the oxide layer OXL, and the metal layer MTL may be formed by chemical vapor deposition, but the present disclosure is not limited thereto. The oxide layer OXL may be located only on the first active layer 350 and might not be located on the second active layer 450. As described above, because the second transistor TR2 does not include an oxide layer injecting excess oxygen (O), only the first gate insulating layer 130 and the metal layer MTL may be formed on the second active layer 450. The metal layer MTL may be partially etched in a subsequent process to form the first gate electrode 310 and the second gate electrode 410.

When the oxide layer OXL is located on the first gate insulating layer 130, the excess oxygen (O) may be supplied to the first gate insulating layer 130 in the oxide layer OXL. Subsequently, when a heat treatment process is performed on the oxide layer OXL, the excess oxygen (O) supplied to the first gate insulating layer 130 is injected into the active layer. Hydrogen (H) contained in the oxygen defect region of the active layer is moved to the first gate insulating layer 130, and the excess oxygen (O) injected from the oxide layer OXL may reduce the number of oxygen defect regions of the active layer. Because a description thereof is the same as described above, a repeated detailed description thereof will be omitted.

The oxide layer OXL may be partially etched and removed in a subsequent process to form the first oxide layer 370. According to some embodiments, the oxide layer OXL may include a crystalline oxide containing tin (Sn). A description thereof is the same as described above. The oxide layer OXL may be located on the first active layer 350, but might not be located on the second active layer 450. As described above, because the first transistor TR1 includes the first oxide layer 370, but the second transistor TR2 does not include the first oxide layer 370, the oxide layer OXL may be located only on the first active layer 350. However, the present disclosure is not limited thereto.

Subsequently, a first etching process of partially etching the metal layer MTL is performed (S520). The first etching process may be an etching process performed by a conventional method. In some embodiments, the first etching process is a patterning process using a photoresist, and may be a wet etching process. The metal layer MTL may be partially etched and removed by the first etching process to form the first gate electrode 310 and the second gate electrode 420. In some embodiments, a portion of the metal layer MTL except regions overlapping with portions of the first active layer 350 and the second active layer 450 may be removed, and the remaining regions may constitute the first gate electrode 310 and the second gate electrode 420, respectively.

Figure 20:
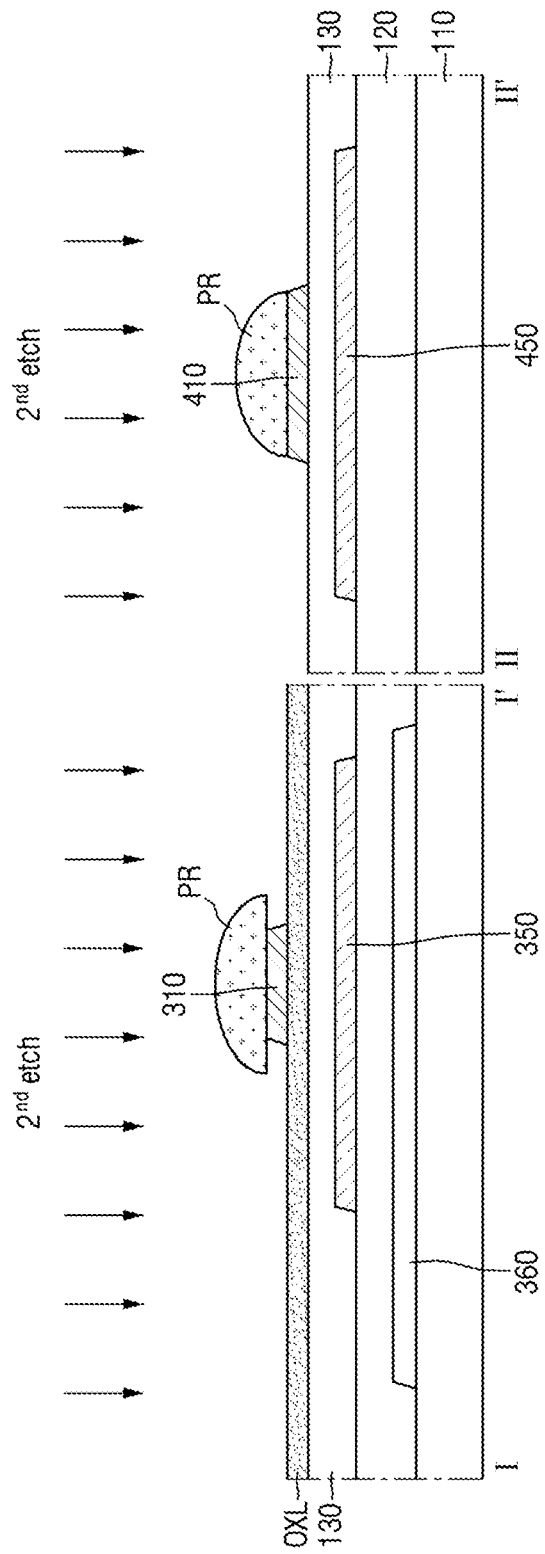

Next, referring to FIG. 20, a photoresist PR is formed on the gate electrodes 310 and 410 (S530), and a second etching process of etching a portion of the oxide layer OXL and the first gate insulating layer 130 is performed (S540).

The photoresist PR may be formed to prevent a partial region of the oxide layer OXL from being etched. In an embodiment, the photoresist PR may be located on the first gate electrode 310 and the second gate electrode 410. The photoresist PR prevents a portion of the oxide layer OXL located below the first gate electrode 310 from being removed, thereby forming the first oxide layer 370 between the first gate electrode 310 and the first active layer 350. The second etching process may remove the oxide layer OXL and the first gate insulating layer 130 located in a region that does not overlap the photoresist PR or the gate electrodes 310 and 410. The first oxide layer 370 may be formed through the second etching process, and the first gate insulating layer 130 may be partially etched and removed.

In some embodiments, the second etching process and the first etching process may be different etching processes. For example, when the first etching process is a wet etching process, the second etching process may be a dry etching process. As described above, the oxide layer OXL may include a crystalline oxide containing tin (Sn), and in this case, the oxide layer OXL may not be etched in the first etching process (e.g., the wet etching process), for forming the gate electrodes 310 and 410, thereby preventing an undercut from being formed below the first gate electrode 310. In other words, the oxide layer OXL constituting the first oxide layer 370 may include a crystalline oxide so as not to be etched in the first etching process.

Figure 21:
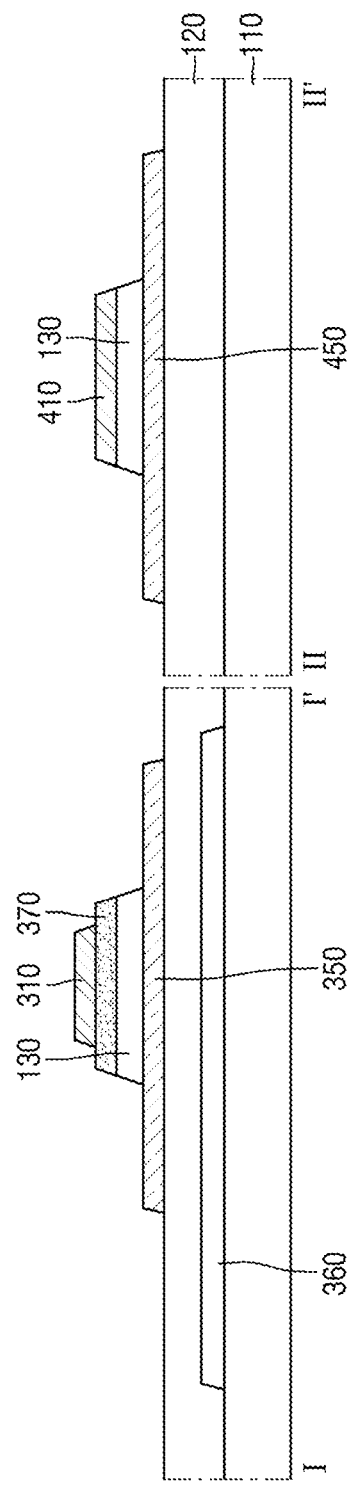

As illustrated in FIG. 21, the first oxide layer 370 and the first gate insulating layer 130 may be formed by performing the second etching process. Meanwhile, according to some embodiments, the photoresist PR formed on the first gate electrode 310 may have a width measured in one direction, which is greater than the width of the first gate electrode 310 measured in the one direction. The width W370 (see FIG. 11) of the first oxide layer 370 formed by the second etching process, which is measured in one direction, may be greater than the width W310 (see FIG. 11) of the first gate electrode 310, which is measured in the one direction. At least one end of the first oxide layer 370 may be formed to protrude more than one end of the first gate electrode 310. These shapes of the first gate electrode 310 and the first oxide layer 370 may be formed through different etching processes (e.g., the first etching process and the second etching process, respectively). A detailed description thereof is the same as described above with reference to FIG. 11.

Figure 22:
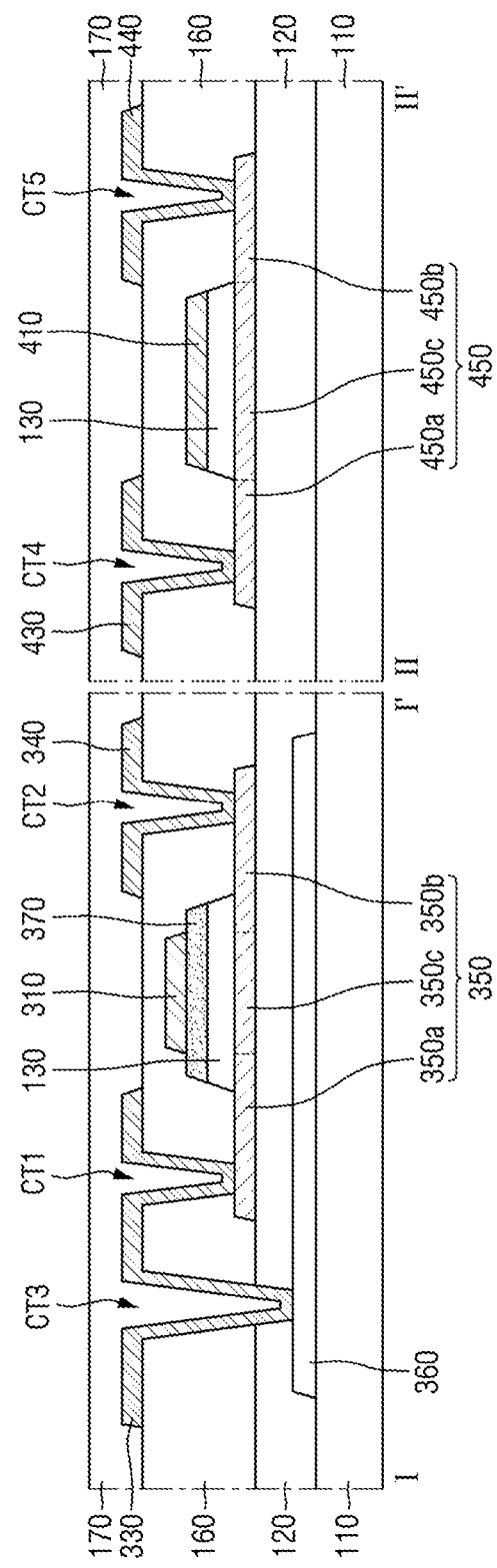

Next, as illustrated in FIG. 22, the first interlayer insulating layer 160, the first and second source electrodes 330 and 430, and the first and second drain electrodes 340 and 440 are formed to form the first transistor TR1 and the second transistor TR2. The first and second source electrodes 330 and 430 and the first and second drain electrodes 340 and 440 may be formed by patterning a metal layer, which is formed on the first interlayer insulating layer 160 by a sputtering method, by an etching process using a photoresist pattern. However, the present disclosure is not limited thereto.

Figure 23:
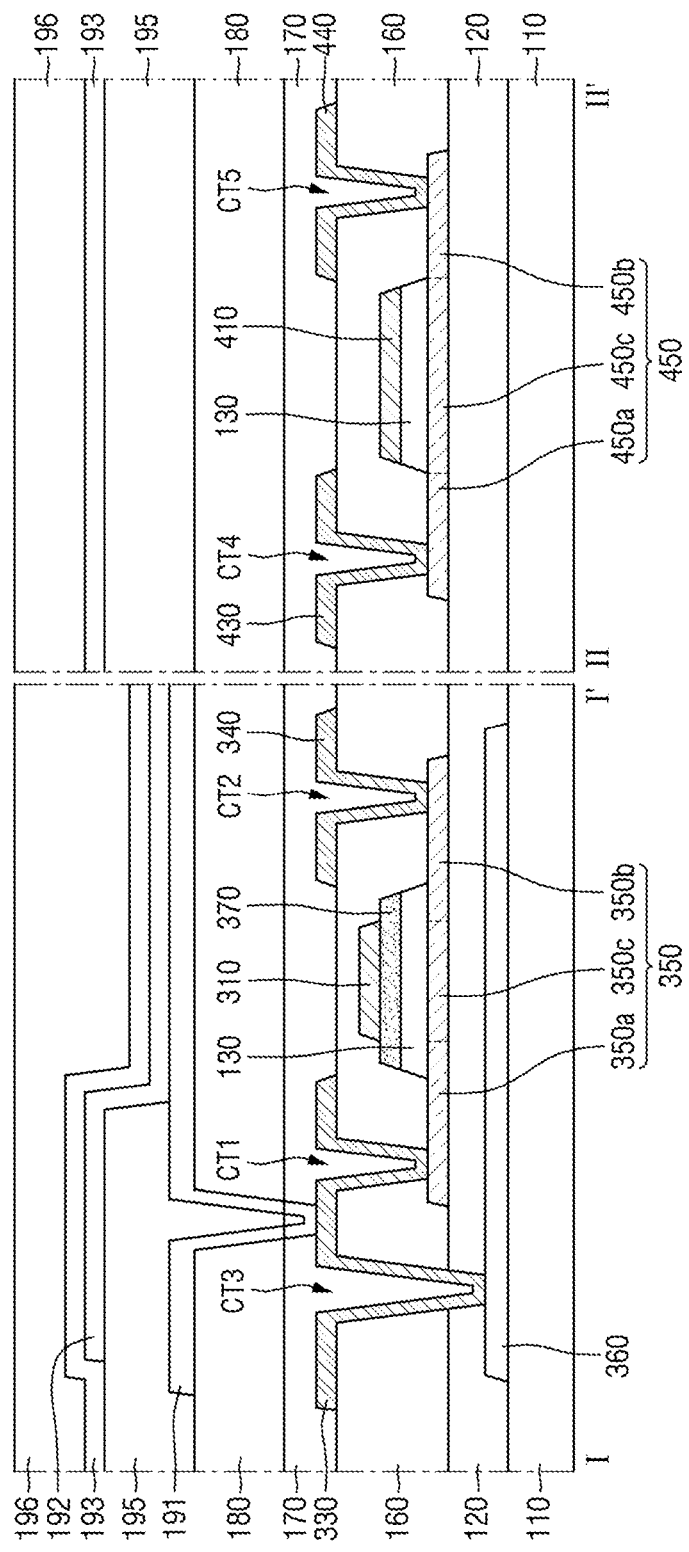

Thereafter, as shown in FIG. 23, the first passivation layer 170, the first planarization layer 180, the first electrode 191, the organic light emitting layer 192, the pixel defining layer 195, the second electrode 193, and the encapsulation layer 196 are formed.

Hereinafter, structures of the first transistor TR1 and the second transistor TR2 according to another embodiment will be described.

According to some embodiments, the second transistor TR2 may also include a second oxide layer including a crystalline oxide containing tin (Sn) between the second active layer 450 and the second gate electrode 410.

FIG. 24 is a cross-sectional view illustrating a second transistor according to another embodiment.

Referring to FIG. 24, a second transistor TR2_1 according to the present embodiment may include a second oxide layer 470_1 located between a second gate electrode 410_1 and a second active layer 450_1. The present embodiment is different from the embodiment of FIG. 10, in that the second transistor TR2_1, which is a switching transistor of each pixel PX, also has the second oxide layer 470_1 containing a crystalline oxide containing tin (Sn). In the following description, a redundant description will be omitted and differences will be mainly described.

The second transistor TR2_1 of FIG. 24 may further include the second oxide layer 470_1. The second oxide layer 470_1 may be located on the first gate insulating layer 130, and may be located between the second gate electrode 410_1 and the second active layer 450_1. The second oxide layer 470_1 may be located to overlap at least the channel region 450c of the second active layer 450_1. As described above, the second oxide layer 470_1 may be formed through an etching process that is different from an etching process for forming the second gate electrode 410_1, and the width of the second oxide layer 470_1 measured in one direction (e.g., in the third direction DR3), may be greater than the width of the second gate electrode 410_1 measured in the same direction. That is, at least one end of the second oxide layer 470_1 may be formed to protrude more than one end of the second gate electrode 410_1.

The second oxide layer 470_1 according to the present embodiment may be formed by disposing the oxide layer OXL formed on the first gate insulating layer 130 on the second active layer 450 during the process of fabricating the display device 1.

Figure 25:
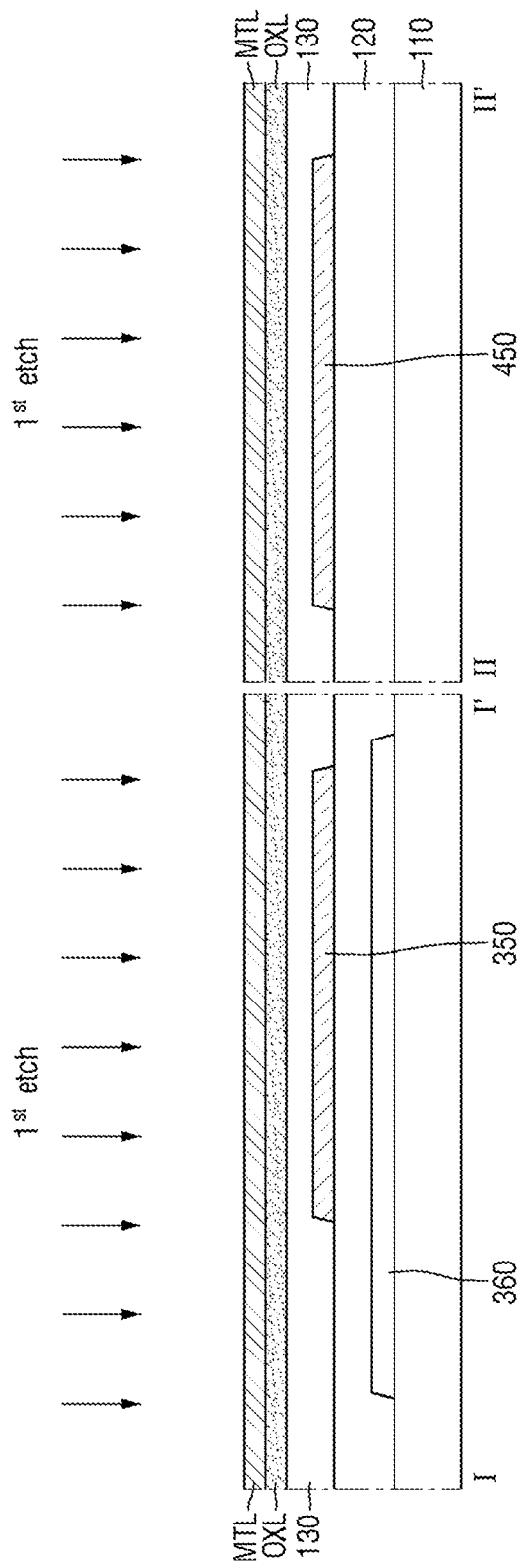
FIGS. 25 to 27 are cross-sectional views illustrating a process of fabricating the second transistor of FIG. 24.
Figure 26:
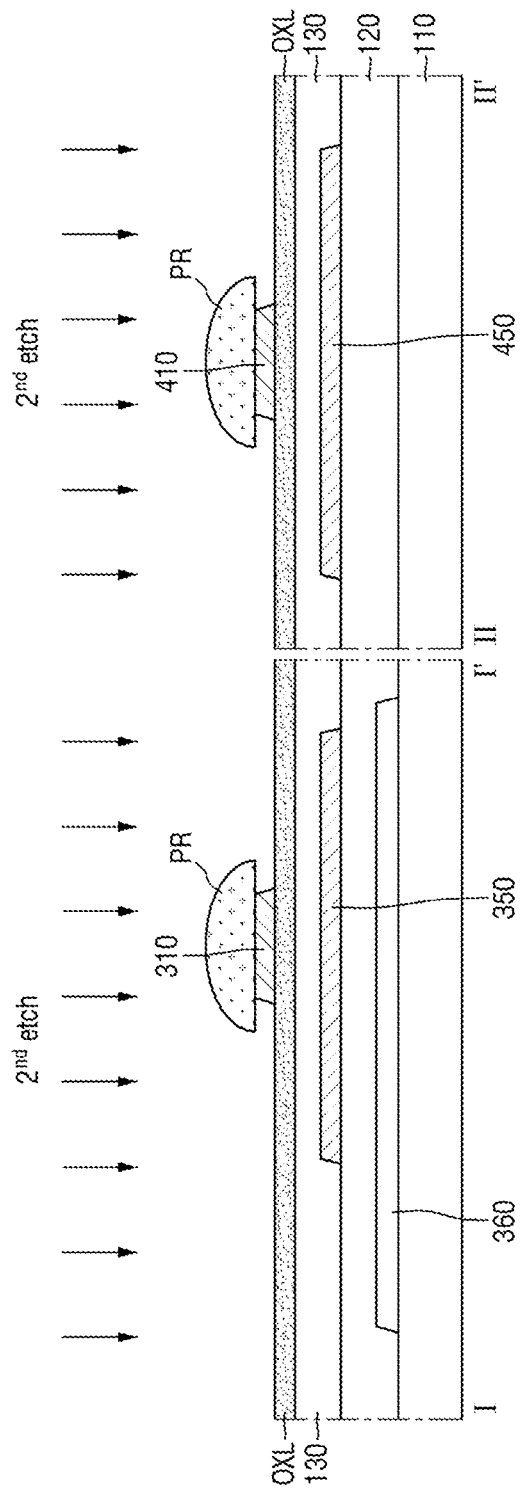
Figure 27:
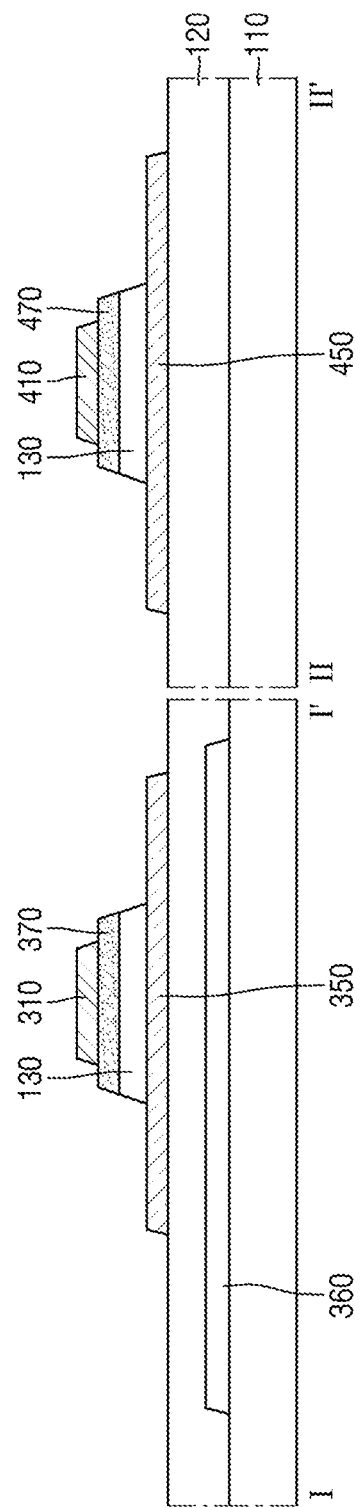

FIGS. 25 to 27 are cross-sectional views illustrating a process of fabricating the second transistor of FIG. 24.

Referring to FIGS. 25 to 27, in a process of forming the oxide layer OXL and the metal layer MTL during the process of fabricating the display device 1, the oxide layer OXL may be formed to overlap at least the first active layer 350 and the second active layer 450 on the first gate insulating layer 130. As illustrated in FIG. 25, the oxide layer OXL may be formed on the first active layer 350 and the second active layer 450, and the metal layer MTL may be formed on the oxide layer OXL. The embodiment of FIG. 25 is different from the embodiment of FIG. 19 in that the oxide layer OXL is formed on the second active layer 450. Accordingly, when the oxide layer OXL is partially etched by performing a subsequent process, the first oxide layer 370 and the second oxide layer 470 may be formed.

As shown in the figure, the metal layer MTL is etched by the first etching process to form the first gate electrode 310 and the second gate electrode 410. Then, as shown in FIG.

26, the photoresist PR is formed on the first gate electrode 310 and the second gate electrode 410. As described above, the photoresist PR formed on the first gate electrode 310 has a width that is greater than that of the first gate electrode 310. Similarly, the photoresist PR formed on the second gate electrode 410 may also have a width that is greater than that of the second gate electrode 410. The first oxide layer 370 and the second oxide layer 470 formed through the second etching process may have widths greater than those of the first gate electrode 310 and the second gate electrode 410, respectively.

Referring to FIG. 27, as the oxide layer OXL and the first gate insulating layer 130 are etched by the second etching process, the first oxide layer 370 may be formed between the first active layer 350 and the first gate electrode 310, and the second oxide layer 470 may be formed between the second active layer 450 and the second gate electrode 410. Because a description thereof is the same as described above, a repeated detailed description thereof will be omitted.

Meanwhile, according to some embodiments, the second transistor TR2 may also include a light blocking layer similar to the first transistor TR1.

Figure 28:
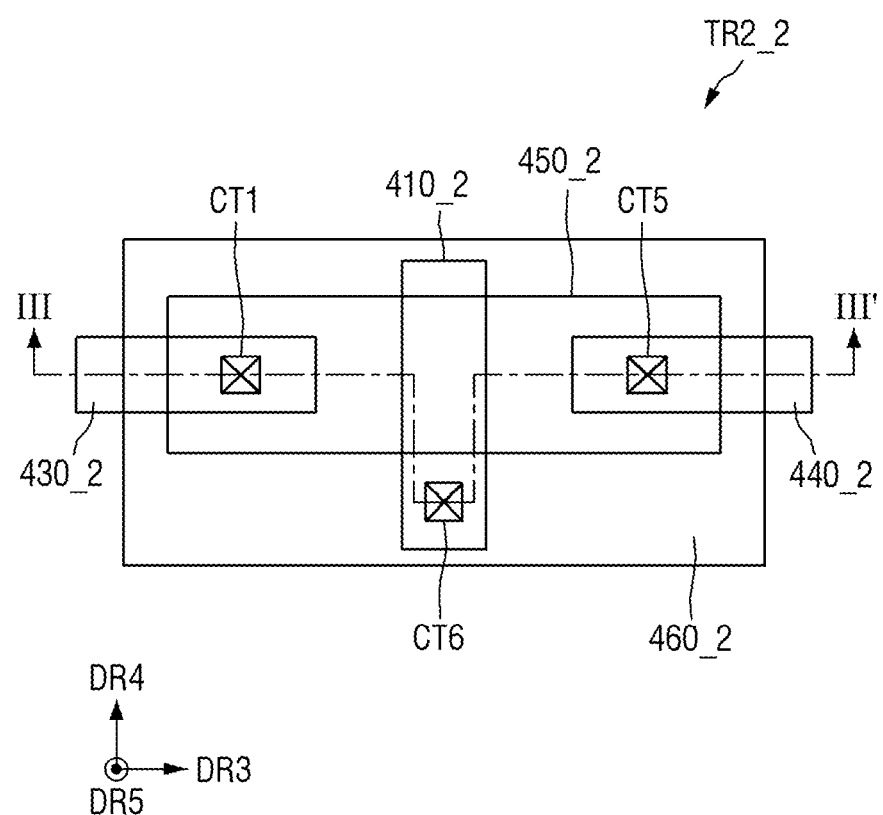
FIG. 28 is a plan view illustrating a second transistor according to another embodiment.
Figure 29:
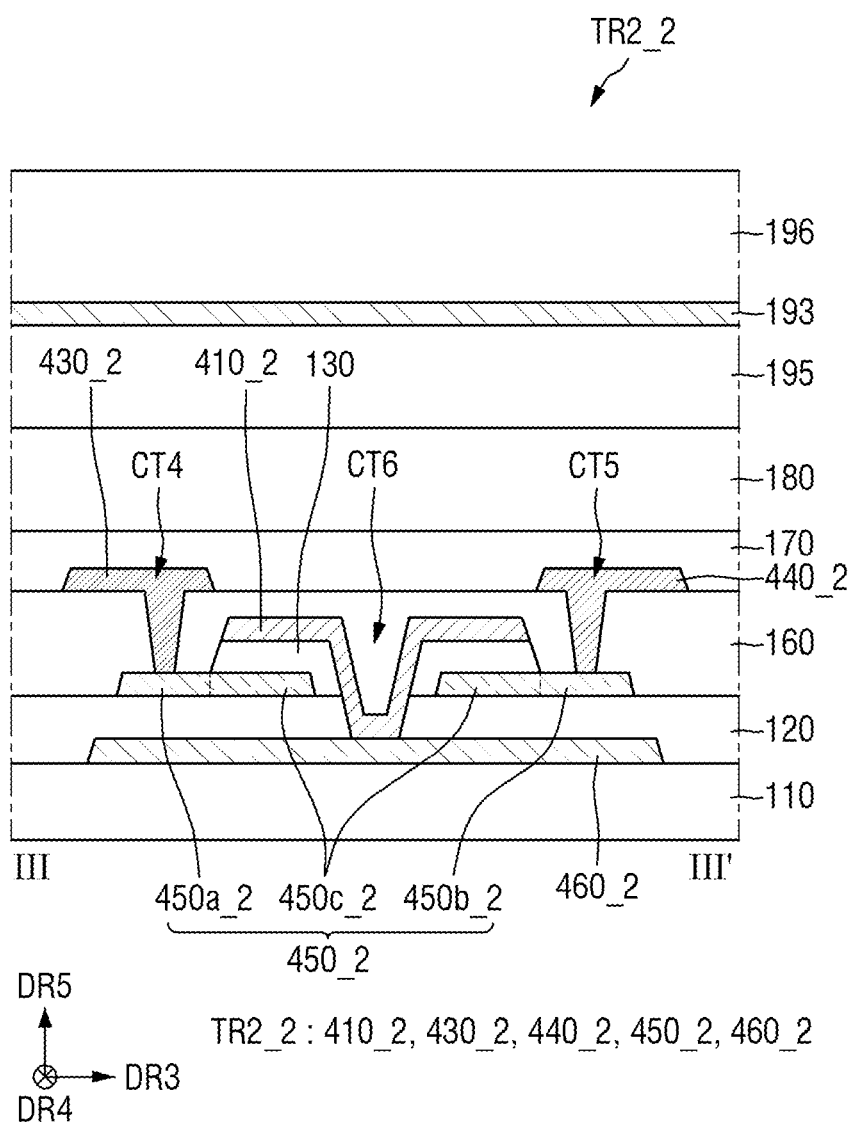
FIG. 29 is a cross-sectional view taken along the line III-III' of FIG. 28.

FIG. 28 is a plan view illustrating a second transistor according to another embodiment. FIG. 29 is a cross-sectional view taken along the line III-III' of FIG. 28.

Referring to FIGS. 28 and 29, a second transistor TR2_2 according to the present embodiment further includes a second light blocking layer 460_2, and a second gate electrode 410_2 may be connected to the second light blocking layer 460_2. The second transistor TR2_2 of FIGS. 28 and 29 is different from the second transistor TR2 of FIGS. 9 and 10 in that the second gate electrode 410_2 is connected to the second light blocking layer 460_2. In the following description, a redundant description will be omitted and differences will be mainly described.

The second transistor TR2_2 of FIGS. 28 and 29 may include the second gate electrode 410_2, a second active layer 450_2, a second source electrode 430_2, a second drain electrode 440_2, and the second light blocking layer 460_2.

The second light blocking layer 460_2 is located on the first substrate 110. The second light blocking layer 460_2 may reduce or prevent light from the outside from being incident on the second active layer 450_2 through the first substrate 110. The length of the second light blocking layer 460_2 in the third direction DR3 and the length of the second light blocking layer 460_2 in the fourth direction DR4 may be longer than the length of the second active layer 450_2 in the third direction DR3 and the length of the second active layer 450_2 in the fourth direction DR4 (e.g. respectively). The second light blocking layer 460_2 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof. The buffer layer 120 may be formed on the second light blocking layer 460_2.

The second gate electrode 410_2 may be in contact with the second light blocking layer 460_2 through a sixth contact hole CT6. The sixth contact hole CT6 may be formed to pass through the first gate insulating layer 130 and the buffer layer 120 to expose the second light blocking layer 460_2. In this case, the second gate electrode 410_2 and the second light blocking layer 460_2 located below the second active layer 450_2 have the same voltage. That is, the second gate electrode 410_2 may serve as an upper gate electrode, and the second light blocking layer 460_2 may serve as a lower gate electrode. Therefore, because the second transistor TR2_2, which is a switching transistor, may be driven in a double gate manner, a leakage current can be prevented or reduced from flowing into a channel region 450c_2 of the second active layer 450_2 of the second transistor TR2_2 when the second transistor TR2_2 is off.

Figure 30:
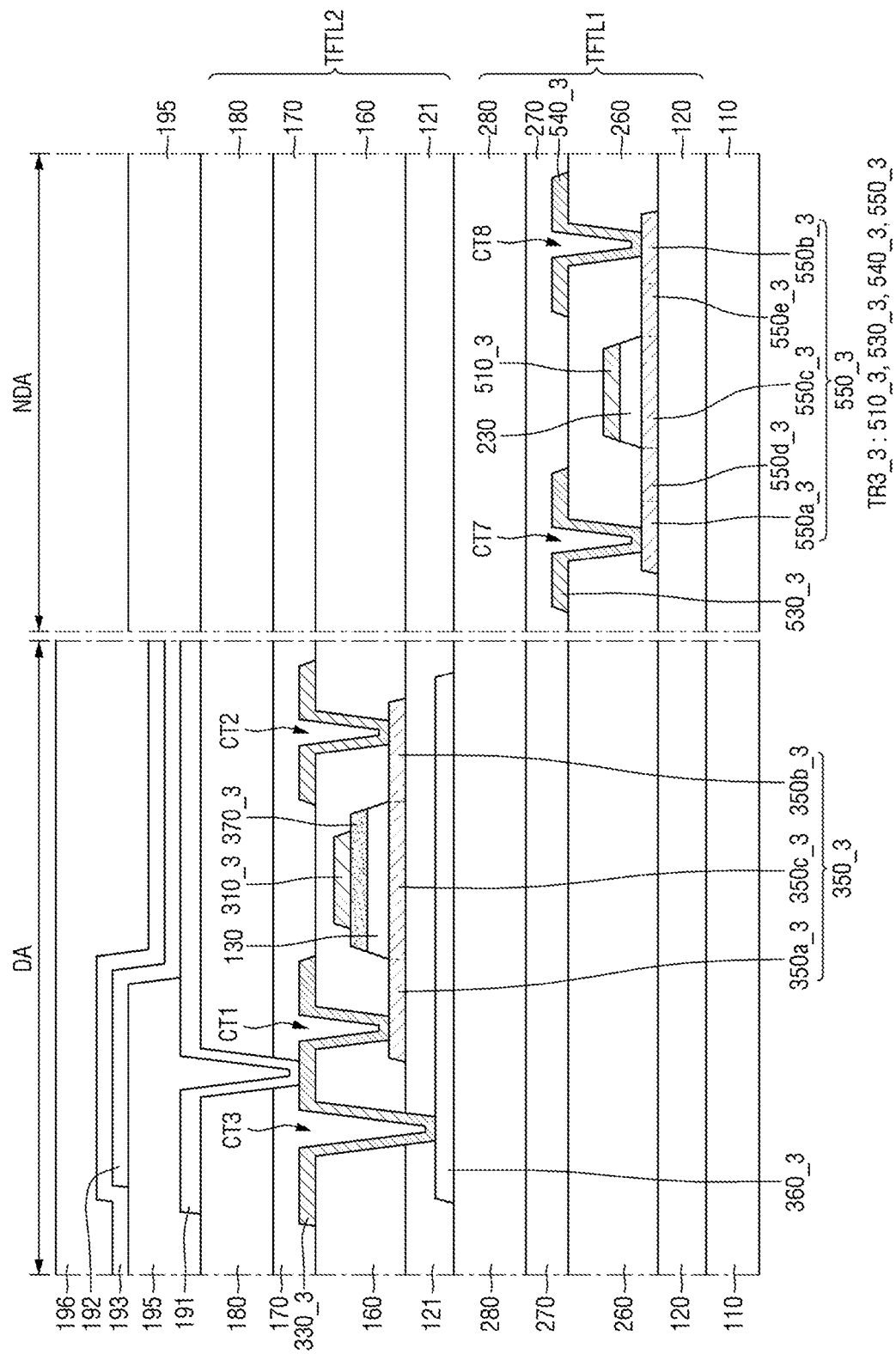
FIG. 30 is a schematic cross-sectional view illustrating a part of a display device according to another embodiment.

FIG. 30 is a schematic cross-sectional view illustrating a part of a display device according to another embodiment.

Referring to FIG. 30, the display device 1 according to the present embodiment may include a plurality of transistor layers TFTL1 and TFTL2. The transistor layers TFTL1 and TFTL2 may include a first transistor layer TFTL1 and a second transistor layer TFTL2, which have different transistors, respectively. In some embodiments, a third transistor (e.g., pull-up transistor) TR3_3 included in the scan driving circuit 30 may be located in the first transistor layer TFTL1, and a first transistor TR1_3 and a second transistor TR2_3 of each pixel PX may be located in the second transistor layer TFTL2 so as to be located above (e.g., at a higher layer than) the third transistor TR3_3. The display device 1 of FIG. 30 is different from those of FIGS. 8 and 14 in that the first transistor TR1 of FIG. 8 and the pull-up transistor TU of FIG. 14 are located in different transistor layers TFTL1 and TFTL2. In the following description, a redundant description will be omitted, and differences will be mainly described.

The first transistor layer TFTL1 includes the third transistor TR3_3 located in the non-display area NDA, and the third transistor TR3_3 includes a third gate electrode 510_3, a third active layer 550_3, a third source electrode 530_3, and a third drain electrode 540_3.

The third active layer 550_3 may be located on the buffer layer 120. The third active layer 550_3 may include polycrystalline silicon, and may include a first high concentration doped region 550a_3, a second high concentration doped region 550b_3, a channel region 550c_3, a first low concentration doped region 550d_3, and a second low concentration doped region 550e_3. The channel region 550c_3 may be formed of polycrystalline silicon that is not doped with impurities. The first high concentration doped region 550a_3 and the second high concentration doped region 550b_3 may be formed of polycrystalline silicon doped with high concentration impurities. The first low concentration doped region 550d_3 and the second low concentration doped region 550e_3 may be formed of polycrystalline silicon doped with low concentration impurities. However, the present disclosure is not limited thereto, and in some cases, the third active layer 550_3 may also be formed of an oxide semiconductor in the same manner as the first active layer 350_3.

A second gate insulating layer 230 is located on the third active layer 550_3. The second gate insulating layer 230 may be formed of, for example, silicon oxide (SiOx), silicon nitride (SiNx), or a stacked structure thereof.

The third gate electrode 510_3 is located on the second gate insulating layer 230. The third gate electrode 510_3 may overlap the third active layer 550_3 with the second gate insulating layer 230 interposed therebetween. For example, the third gate electrode 510_3 may be formed as a single layer or multiple layers made of any one of molybdenum (Mo), aluminum (Al), chromium (Cr), gold (Au), titanium (Ti), nickel (Ni), neodymium (Nd), and/or copper (Cu) and/or an alloy thereof.

Meanwhile, it is illustrated in the drawing that the second gate insulating layer 230 is located only between the third active layer 550_3 and the third gate electrode 510_3, but embodiments of the present disclosure are not limited thereto. That is, the second gate insulating layer 230 may also be formed on the upper and side surfaces of the third active layer 550_3.

The second interlayer insulating layer 260 is located on the third gate electrode 510_3. The second interlayer insulating layer 260 may be formed of an inorganic material, such as silicon oxide (SiOx), silicon nitride (SiNx), or a stacked structure thereof.

The second interlayer insulating layer 260 may include a seventh contact hole CT7 passing through the second interlayer insulating layer 260 to expose a portion of the upper surface of the third active layer 550_3, and an eighth contact hole CT8 passing through the second interlayer insulating layer 260 to expose another portion of the upper surface of the third active layer 550_3. That is, the seventh contact hole CT7 may be formed to expose the first high concentration doped region 550a_3 of the third active layer 550_3, and the eighth contact hole CT8 may be formed to expose the second high concentration doped region 550b_3 of the third active layer 550_3.

The third source electrode 530_3 and the third drain electrode 540_3 of the third transistor TR3_3 are located on the second interlayer insulating layer 260.

The third source electrode 530_3 is in contact with the first high concentration doped region 550a_3 formed on one side of the third active layer 550_3 through the seventh contact hole CT7. The third drain electrode 540_3 is in contact with the second high concentration doped region 550b_3 formed on the other side of the third active layer 550_3 through the eighth contact hole CT8.

A second passivation layer 270 is formed on the third source electrode 530_3 and the third drain electrode 540_3. The second passivation layer 270 may be formed of an inorganic layer, for example, a silicon oxide (SiOx) layer, a silicon nitride (SiNx) layer, or a multilayer thereof.

A second planarization layer 280 is located on the second passivation layer 270. The second planarization layer 280 may planarize a step due to the thin film transistor such as the third transistor TR3_3. The second planarization layer 280 may be formed of an organic layer such as acryl resin, epoxy resin, phenolic resin, polyamide resin, polyimide resin and the like.

Instead of the buffer layer 120 described above with reference to FIGS. 7 to 10, an insulating layer 121 may be located on the second planarization layer 280. Further, the first interlayer insulating layer 160, the first passivation layer 170, and the first planarization layer 180 described above with reference to FIGS. 7 to 10 may be formed on the insulating layer 121.

In the embodiment of FIG. 30, unlike the embodiment of FIG. 14, the first transistor layer TFTL1 including the pull-up transistor, the pull-down transistor, and the distribution transistors included in the scan driving circuit 30 located in the non-display area NDA may be located. Further, the second transistor layer TFTL2 including the first transistor TR1 and the second transistor TR2, which are a driving transistor and a switching transistor of each of the pixels PX, may be located in the display area DA. Because the second transistor layer TFTL2 is located above the first transistor layer TFTL1, the transistors located in the display area DA may be located above the transistors located in the non-display area NDA. The light emitting elements EL including the first electrode 191, the organic light emitting layer 192, and the second electrode 193 may be formed on the second transistor layer TFTL2.

In concluding the detailed description, those skilled in the art will appreciate that many variations and modifications can be made to the embodiments without substantially departing from the principles or the spirit and scope of the present invention. Therefore, the disclosed embodiments of the invention are used in a generic and descriptive sense only and not for purposes of limitation.

What is claimed is:

1. A display device comprising pixels connected to scan lines, and to data lines crossing the scan lines, each of the pixels comprising a light emitting element, and a first transistor configured to control a driving current supplied to the light emitting element according to a data voltage applied from the data line, the first transistor comprising a first active layer having an oxide semiconductor, and a first oxide layer on the first active layer and having a crystalline oxide containing tin (Sn),
wherein one of the pixels comprises a second transistor for applying the data voltage of a corresponding one of the data lines to the first transistor according to a scan signal applied to a corresponding one of the scan lines, and
wherein the second transistor comprises a second active layer having an oxide semiconductor, a second gate insulating layer on the second active layer, and a second gate electrode on the second gate insulating layer and overlapping the second active layer.

2. The display device of claim 1, wherein the second transistor further comprises a second oxide layer between the second gate insulating layer and the second gate electrode and partially overlapping the second active layer.

3. The display device of claim 2, further comprising a scan driving circuit configured to output a scan signal to the scan lines,
wherein the scan driving circuit comprises a third transistor comprising a third active layer having an oxide semiconductor, and a third gate electrode on the third active layer, the third transistor being configured such that the first oxide layer is not between the third active layer and the third gate electrode.

4. The display device of claim 1, wherein the first oxide layer has a content of the tin in a range of about 1 at. % to about 100 at. % with respect to a content of cations contained in the crystalline oxide.

5. The display device of claim 4, wherein the first oxide layer comprises tin-zinc oxide (TZO), tin-gallium oxide (TGO), indium-tin-zinc oxide (ITZO), indium-tin-gallium oxide (ITGO), or indium-tin-zinc-gallium oxide (ITZGO).

6. The display device of claim 5, wherein the first active layer comprises indium-tin oxide (ITO), indium-tin-gallium oxide (ITGO), indium-gallium-zinc oxide (IGZO), or indium-gallium-zinc-tin oxide (IGZTO).

7. The display device of claim 1, wherein the first transistor comprises a first gate insulating layer on the first active layer, and a first gate electrode on the first gate insulating layer and overlapping the first active layer, and
wherein the first oxide layer is between the first gate electrode and the first gate insulating layer.

8. The display device of claim 7, wherein a concentration of oxygen in the first active layer is greater than a concentration of oxygen in the first oxide layer.

9. The display device of claim 7, wherein at least one end of the first oxide layer protrudes outward beyond one end of the first gate electrode.

10. The display device of claim 9, wherein a width of the first oxide layer is greater than a width of the first gate electrode.

11. The display device of claim 9, wherein at least a portion of an upper surface of the first oxide layer is in contact with a first interlayer insulating layer on the first gate electrode.

12. The display device of claim 7, wherein the first active layer comprises a first conducting region, a second conducting region, and a channel region between the first conducting region and the second conducting region, and
wherein at least a portion of the first oxide layer overlaps the channel region of the first active layer.

13. The display device of claim 12, wherein a width of the first oxide layer is greater than a width of the channel region of the first active layer.

14. The display device of claim 12, wherein the first transistor further comprises:
a first interlayer insulating layer on the first gate electrode;
a first source electrode in contact with the first conducting region via a first contact hole passing through the first interlayer insulating layer; and
a first drain electrode in contact with the second conducting region via a second contact hole passing through the first interlayer insulating layer.

15. The display device of claim 14, wherein the first transistor further comprises:
a first light blocking layer below the first active layer; and
a buffer layer between the first active layer and the first light blocking layer, and
wherein the first source electrode is in contact with the first light blocking layer via a third contact hole passing through the first interlayer insulating layer and the buffer layer.

16. A display device comprising:
a substrate comprising a display area and a non-display area;
a first active layer in the display area;
a second active layer in the non-display area, and comprising a third conducting region, a fourth conducting region, and a channel region between the third conducting region and the fourth conducting region;
a gate insulating layer on the first active layer and the second active layer;
a first gate electrode on the gate insulating layer and partially overlapping the first active layer;
a second gate electrode on the gate insulating layer and partially overlapping the second active layer;
a first interlayer insulating layer on the first gate electrode and a second interlayer insulating layer on the second gate electrode;
a first source electrode and a first drain electrode on the first interlayer insulating layer and in the display area;
a second source electrode in contact with the third conducting region via a fourth contact hole passing through the second interlayer insulating layer, and a second drain electrode in contact with the fourth conducting region via a fifth contact hole passing through the second interlayer insulating layer in the non-display area; and
an oxide layer on the gate insulating layer, and having a crystalline oxide containing tin (Sn),
wherein the first active layer and the second active layer comprise an oxide semiconductor.

17. The display device of claim 16, wherein the oxide layer is not between the second gate electrode and the gate insulating layer.

18. The display device of claim 17, wherein the oxide layer comprises a first oxide layer between the first gate electrode and the gate insulating layer, and
wherein a width of the first oxide layer is greater than a width of the first gate electrode.

19. The display device of claim 18, wherein the first active layer comprises a first conducting region, a second conducting region, and a channel region between the first conducting region and the second conducting region, and
wherein at least a portion of the first oxide layer overlaps the channel region of the first active layer.

20. The display device of claim 19, wherein the first source electrode is in contact with the first conducting region via a first contact hole passing through the first interlayer insulating layer, and
wherein the first drain electrode is in contact with the second conducting region via a second contact hole passing through the first interlayer insulating layer.

21. The display device of claim 20, further comprising:
a first light blocking layer below the first active layer; and
a buffer layer between the first active layer and the first light blocking layer,
wherein the first source electrode is in contact with the first light blocking layer via a third contact hole passing through the first interlayer insulating layer and the buffer layer.

22. A method for fabricating a display device, the method comprising:
forming a substrate, an active layer on the substrate, and a gate insulating layer on the active layer, the active layer comprising a first active layer, and a second active layer comprising a third conducting region, a fourth conducting region, and a channel region between the third conducting region and the fourth conducting region;
forming an oxide layer on the gate insulating layer and having a crystalline oxide containing tin (Sn), and a metal layer on the oxide layer;
performing a first etching for etching at least a portion of the metal layer to form a first gate electrode and a second gate electrode;
performing a second etching for etching at least a portion of the oxide layer and the gate insulating layer to form a first oxide layer;
forming a first interlayer insulating layer on the first gate electrode, and a second interlayer insulating layer on the second gate electrode; and
forming a second source electrode in contact with the third conducting region via a fourth contact hole passing through the second interlayer insulating layer, and a second drain electrode in contact with the fourth conducting region via a fifth contact hole passing through the second interlayer insulating layer.

23. The method of claim 22, wherein the first active layer and the second active layer have an oxide semiconductor,
wherein the first gate electrode overlaps the first active layer and the second gate electrode overlaps the second active layer, and
wherein the first oxide layer is between the first gate electrode and the first active layer.

24. The method of claim 23, wherein a width of the first oxide layer is greater than a width of the first gate electrode.

25. The method of claim 23, wherein the first oxide layer is not between the second active layer and the second gate electrode.

26. The method of claim 23, wherein the first etching comprises a wet etching process, and the second etching comprises a dry etching process.

* * * * *

UNITED STATES PATENT AND TRADEMARK OFFICE
CERTIFICATE OF CORRECTION

PATENT NO. : 11,251,247 B2
APPLICATION NO. : 16/843764
DATED : February 15, 2022
INVENTOR(S) : Hyung Jun Kim et al.

It is certified that error appears in the above-identified patent and that said Letters Patent is hereby corrected as shown below:

In the Claims
Column 31, Line 65, Claim 18         Delete "claim 17," and
                                     Insert -- claim 16, --

Signed and Sealed this
Twenty-ninth Day of August, 2023

*Katherine Kelly Vidal*

Katherine Kelly Vidal
*Director of the United States Patent and Trademark Office*